United States Patent
Lee et al.

(10) Patent No.: US 9,070,569 B2
(45) Date of Patent: Jun. 30, 2015

(54) SEMICONDUCTOR MEMORY DEVICES AND SEMICONDUCTOR PACKAGES

(71) Applicants: Ho-Cheol Lee, Yongin-si (KR); Chi-Sung Oh, Gunpo-si (KR); Jin-Kuk Kim, Hwaseong-si (KR)

(72) Inventors: Ho-Cheol Lee, Yongin-si (KR); Chi-Sung Oh, Gunpo-si (KR); Jin-Kuk Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/450,359

(22) Filed: Aug. 4, 2014

(65) Prior Publication Data

US 2014/0346516 A1    Nov. 27, 2014

Related U.S. Application Data

(63) Continuation of application No. 12/891,141, filed on Sep. 27, 2010, now Pat. No. 8,796,863.

(60) Provisional application No. 61/302,773, filed on Feb. 9, 2010.

(30) Foreign Application Priority Data

Mar. 2, 2010    (KR) .................. 10-2010-0018362

(51) Int. Cl.
*H01L 25/065* (2006.01)
*G11C 5/02* (2006.01)
(Continued)

(52) U.S. Cl.
CPC ............ *H01L 25/0657* (2013.01); *G11C 5/025* (2013.01); *G11C 5/06* (2013.01); *H01L 2224/16145* (2013.01); *H01L 2224/16225* (2013.01); *H01L 2224/32225* (2013.01); *H01L 2224/48227* (2013.01); *H01L 2224/73207* (2013.01); *H01L 2224/73265* (2013.01); *H01L 2924/15311* (2013.01); *H01L 22/32* (2013.01); *H01L 24/09* (2013.01); *H01L 27/0255* (2013.01); *H01L 27/108* (2013.01);
(Continued)

(58) Field of Classification Search
CPC ...................................................... H01L 24/09
See application file for complete search history.

(56) References Cited

U.S. PATENT DOCUMENTS 5,448,516 A    9/1995    Tsukikawa et al.
5,838,627 A    11/1998    Tomishima et al.
(Continued)

FOREIGN PATENT DOCUMENTS

JP    04-155859    5/1992
JP    05-210968    8/1993
(Continued)

OTHER PUBLICATIONS

Japanese Office Action Dated Nov. 10, 2014 Related to Japanese Application 2011-025905.

*Primary Examiner* — Stephen W Smoot
(74) *Attorney, Agent, or Firm* — Volentine & Whitt, PLLC

(57) ABSTRACT

A semiconductor memory device includes a semiconductor die and an input-output bump pad part. The semiconductor die includes a plurality of memory cell arrays. The input-output bump pad part is formed in a central region of the semiconductor die. The input-output bump pad part provides a plurality of channels for connecting each of the memory cell arrays independently to an external device. The semiconductor memory device may adopt the multi-channel interface, thereby having high performance with relatively low power consumption.

20 Claims, 28 Drawing Sheets

(51) Int. Cl.
*G11C 5/06* (2006.01)
*H01L 21/66* (2006.01)
*H01L 23/00* (2006.01)
*H01L 27/02* (2006.01)
*H01L 27/108* (2006.01)

(52) U.S. Cl.
CPC ............... H01L2224/0912 (2013.01); H01L 2224/09179 (2013.01); H01L 2224/09515 (2013.01); H01L 2225/06541 (2013.01)

(56) References Cited

U.S. PATENT DOCUMENTS

| | | | |
|---|---|---|---|
| 6,569,727 B1 * | 5/2003 | Casper et al. | ............... 438/210 |
| 7,282,693 B2 | 10/2007 | Onodera et al. | |
| 7,466,577 B2 | 12/2008 | Sekiguchi et al. | |
| 7,869,245 B2 | 1/2011 | Nasu | |
| 8,116,100 B2 | 2/2012 | Saen et al. | |
| 8,319,351 B2 | 11/2012 | Lee | |
| 2006/0118972 A1 * | 6/2006 | Baek et al. | .................... 257/786 |
| 2010/0078790 A1 | 4/2010 | Ito et al. | |
| 2010/0327457 A1 | 12/2010 | Mabuchi | |

FOREIGN PATENT DOCUMENTS

| | | |
|---|---|---|
| JP | 07-135301 | 5/1995 |
| JP | 08-212774 | 8/1995 |
| JP | 2004-103860 | 4/2004 |
| JP | 2008141123 | 6/2008 |
| JP | 2008-251666 | 10/2008 |
| JP | 2008-282108 | 11/2008 |
| JP | 2005-340389 | 12/2008 |
| JP | 2008-300469 | 12/2008 |
| JP | 2010-021306 | 1/2010 |

* cited by examiner

MULTI-CHANNEL

MULTI-PORT

SEMICONDUCTOR MEMORY DEVICES AND SEMICONDUCTOR PACKAGES

CROSS-REFERENCE TO RELATED APPLICATIONS

This application is a Continuation application of U.S. application Ser. No. 12/891,141, filed Sep. 27, 2010, now U.S. Pat. No. 8,796,863, which is the U.S. non-provisional application claims the benefit of priority under 35 USC §119 to U.S. Provisional Application No. 61/302,773 filed on Feb. 9, 2010 in the USPTO, and Korean Patent Application No. 10-2010-0018362 filed on Mar. 2, 2010 in the Korean Intellectual Property Office (KIPO), the contents of each of which are herein incorporated by reference in their entirety for all purposes as if fully set forth herein.

BACKGROUND

1. Technical Field

Example embodiments relate to semiconductor devices, and more particularly to semiconductor memory devices and semiconductor packages having a multi-channel interface.

2. Description of the Related Art

Various interfaces have been developed to provide a semiconductor memory device having high performance with relatively low power consumption. Recently, the low power double data rate 2 (LPDDR2) standard has been adopted to support portable devices such as a mobile phone, a smart phone, a personal digital assistant (PDA), a portable multimedia player (PMP), a digital multimedia broadcast (DMB) device, a global positioning system (GPS) device, a handheld gaming console, etc. The LPDDR2 standard is intended to provide increased memory capacity, improved performance, smaller size, and an overall reduction in power consumption of the memory devices.

However there is a growing demand for mobile devices to be able to support ever more processor-intensive applications such as 3D gaming, streaming communications with rich content, high definition television (HDTV), and even video at beyond HDTV resolutions. Such applications drive increased performance requirements for the memory devices employed in mobile devices. In addition, there is a need for a reduction in power consumption in these memory devices due to limited battery capacity in portable devices.

SUMMARY

Accordingly, the inventive concept is provided to substantially obviate one or more problems due to limitations and disadvantages of the related art.

Some example embodiments provide a wide input-output semiconductor memory device having a multi-channel interface and having high performance with relatively low power consumption.

Some example embodiments provide a semiconductor package including the semiconductor memory device.

In some example embodiments of the inventive concept, a semiconductor memory device includes a semiconductor die having an input-output bump pad part. The semiconductor die includes a plurality of memory cell arrays. The input-output bump pad part is formed in a central region of the semiconductor die. The input-output bump pad part provides a plurality of channels for connecting each of the memory cell arrays independently to one or more external devices.

The input-output bump pad part may include a plurality of channel bump pad parts respectively corresponding to each of the memory cell arrays. Each of the channel bump pad parts may include a plurality of bump pads that are arranged in a matrix of rows and columns.

Each of the channel bump pad parts may include an address-command pad block of address-command bump pads and a plurality of data pad blocks of data bump pads.

The address-command pad block may be disposed between the data pad blocks or at one side of the plurality of the data pad blocks, according to some example embodiments.

Each of the data pad blocks may include at least one row of power bump pads receiving power supply voltages. Each of the data pad blocks may include at least one column of power bump pads receiving power supply voltages.

In some embodiments, each of the data pad blocks may include power bump pads receiving power supply voltages, the power bump pads being disposed in a central region of each data pad block and the data bump pads being disposed to surround the power bump pads.

The semiconductor die may include a plurality of input-output control circuits, each of the input-output control circuits being disposed between a corresponding memory cell array and a corresponding channel bump pad part. A row-directional length of each input-output control circuit may be identical to or smaller than a row-directional length of each channel bump pad part.

Each of the data pad blocks may include a number N of data bump pads, where N is a positive integer. A number N of output drivers and a number N of input buffers may be disposed in the corresponding input-output control circuit and in the semiconductor die under the corresponding channel bump pad part.

Each of the channel bump pad parts may include a plurality of data bump pads. An output driver and a decoupling capacitor may be formed in the semiconductor die under some or all of the data bump pads.

Each input buffer may be further formed in the semiconductor die under some or all of the data bump pads, according to some example embodiments.

Each of the channel bump pad parts may include a plurality of address-command bump pads and a plurality of power bump pads. A decoupling capacitor may be formed in the semiconductor die under some or all of the address-command bumps, and under some or all of the power bump pads.

A clamp diode and/or an electrostatic discharge protection circuit may be further formed in the semiconductor die under some or all of the address-command bump pads, according to some example embodiments.

An electrostatic discharge protection circuit may be further formed in the semiconductor die under some or all of the power bump pads, according to some example embodiments.

Each of the channel bump pad parts may include one or more dummy pads that are electrically disconnected from the semiconductor die. A decoupling capacitor may be formed in the semiconductor die under some or all of the dummy pads.

An electrostatic discharge protection circuit may be further formed in the semiconductor die under some or all of the dummy pads, according to some example embodiments.

The semiconductor die may further include first circuits and second circuits. The first circuits may control, independently per channel, the memory cell arrays. The second circuits may control commonly the memory cell arrays.

Each of the first circuits may be disposed between a corresponding memory cell array and a corresponding channel bump pad part. The second circuits may be disposed on both sides of the input-output bump pad part, or disposed in a column direction along a vertical center line of the semiconductor die.

Each of the first circuits may be disposed between the corresponding memory cell array and the corresponding channel bump pad part. The second circuits may be disposed adjacent to sides of the semiconductor die.

In some embodiments, the semiconductor memory device may further include a test pad part for testing operations of the semiconductor memory device.

The test pad part may be disposed in a column direction along a vertical center line of the semiconductor die, or disposed in the column direction adjacent to left and right sides of the semiconductor die.

The test pad part may be disposed in a row direction along a horizontal center line of the semiconductor die, or disposed in the row direction adjacent to upper and bottom sides of the semiconductor die.

In some embodiments, the semiconductor memory device may further include a support bump pad part. The support bump pad part may be disposed adjacent to four corners of the semiconductor die or disposed adjacent to two or more sides of the semiconductor die. The support bump pad part may include power bump pads receiving power supply voltages.

In some example embodiments of the inventive concept, a semiconductor memory device includes a plurality of semiconductor dies that are stacked and a plurality of input-output bump pad parts. Each semiconductor die includes a plurality of memory cell arrays. A plurality of input-output bump pad parts is respectively formed in a central region of each semiconductor die. The input-output bump pad parts provide a plurality of channels for connecting each of the memory cell arrays independently to one or more external devices.

The semiconductor memory device may further include a plurality of support bump pad parts. Each support bump pad part may be disposed adjacent to four corners of each semiconductor die or disposed adjacent to two or more sides of each semiconductor die.

Each semiconductor die may further include through-silicon-vias for electrically connecting the input-output bump pad parts.

In some example embodiments of the inventive concept, a semiconductor package includes a base substrate, a controller chip and at least one semiconductor memory device. The controller chip is disposed on the base substrate. The at least one semiconductor memory device is disposed on the controller chip. The semiconductor memory device includes a semiconductor die having an input-output bump pad part. The semiconductor die includes a plurality of memory cell arrays. The input-output bump pad part is formed in a central region of the semiconductor die. The input-output bump pad part provides a plurality of channels for connecting each of the memory cell arrays independently to the controller chip.

The semiconductor memory device according to example embodiments may have a multi-channel and wide input-output interface and thus the semiconductor memory device according to example embodiments may reduce power consumption with an increase of operational frequency, and simultaneously support a processor of high performance.

The semiconductor memory device according to example embodiments may have the input-output bump pad part formed in the central region of the semiconductor die, and thus the semiconductor memory device according to example embodiments may be conveniently coupled to other devices or chips of various structures or the layout may be easily modified depending on changes of manufacturing process.

The semiconductor memory device according to example embodiments may include the support bump pad part located in marginal or edge regions of the semiconductor die, thereby enhancing the reliability of a chip-on-chip packaging arrangement.

In the semiconductor memory device according to example embodiments, the plurality of memory cell arrays, the plurality of channel bump pad and/or some of the peripheral circuits may be designed using mirror images or shifted images, thereby effectively designing the semiconductor memory device and minimizing process variation.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
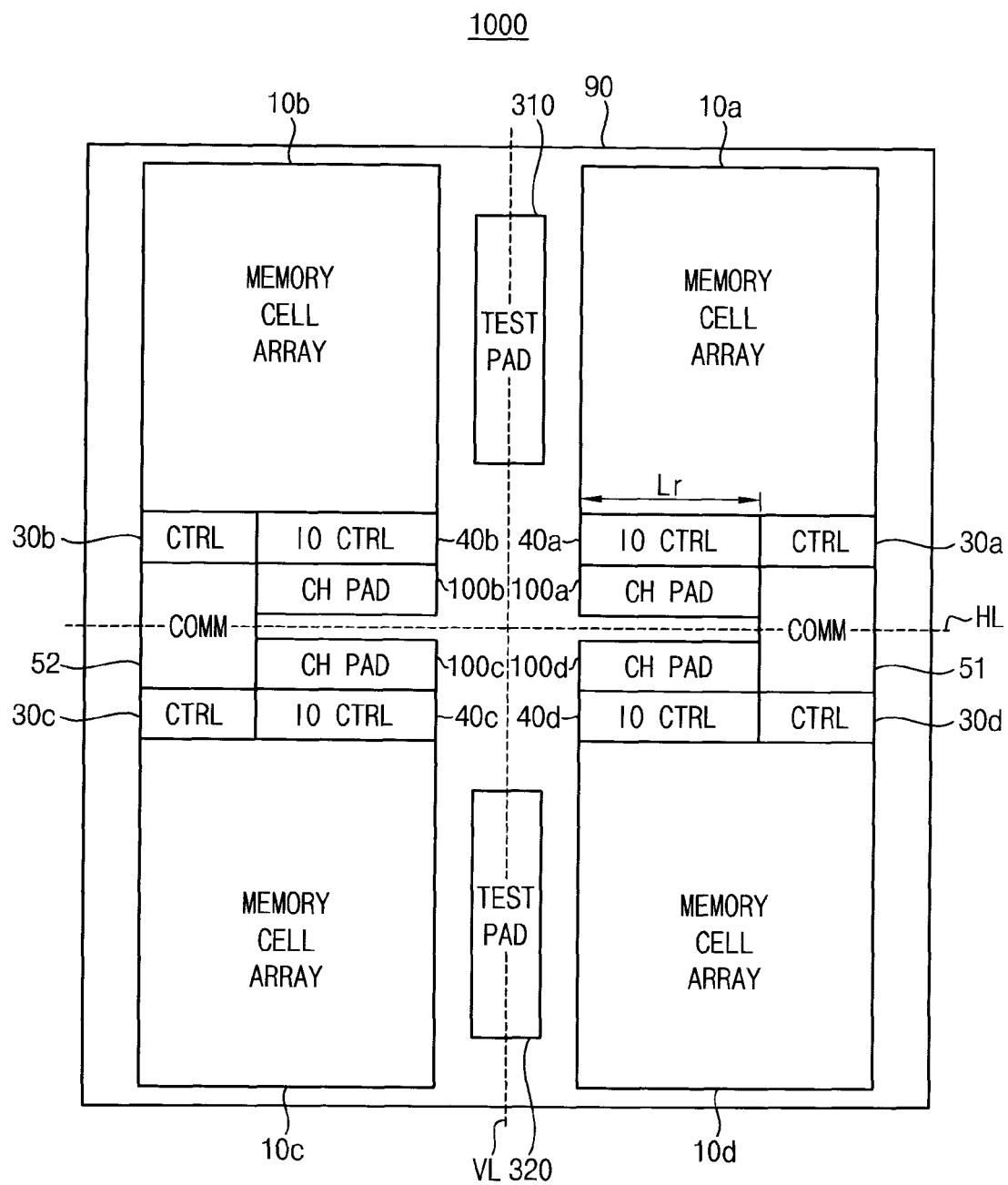
FIG. 1 is a diagram illustrating a layout of a semiconductor memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a layout of a semiconductor memory device 1000 according to example embodiments.

Referring to FIG. 1, semiconductor memory device 1000 includes a semiconductor die 90 having an input-output bump pad part formed in a central region of semiconductor die 90. Semiconductor die 90 includes a plurality (e.g., four) of memory cell arrays 10a, 10b, 10c and 10d associated with respective independent channels. The input-output bump pad part provides a plurality of channels for connecting each of the memory cell arrays 10a, 10b, 10c and 10d independently to an external device, such as a memory controller.

As illustrated in FIG. 1, the input-output bump pad part includes a plurality of channel bump pad parts 100a, 100b, 100c and 100d for independent channels, which respectively correspond to each of the memory cell arrays 10a, 10b, 10c and 10d. In other words, a first channel bump pad part 100a provides a channel dedicated to a first memory cell array 10a, a second channel bump pad part 100b provides a channel dedicated to a second memory cell array 10b, a third channel bump pad part 100c provides a channel dedicated to a third memory cell array 10c, and a fourth channel bump pad part 100d provides a channel dedicated to a fourth memory cell array 10d. As will be described with reference to FIGS. 3A, 3B, 4A, 4B, 5A, 5B, 6A and 6B, each of the channel bump pad parts 100a, 100b, 100c and 100d includes a plurality of bump pads that are arranged in a matrix of rows and columns.

Each of the memory cell arrays 10a, 10b, 10c and 10d includes memory cells coupled to word lines and bit lines, and the memory cells may be grouped into memory banks and/or memory blocks in each memory cell array. Row decoders, column decoders, sense amplifiers for input-output operations may be disposed in the memory cell arrays. Particularly, the sense amplifiers may be located in marginal regions of the memory cell arrays 10a, 10b, 10c and 10d near the channel bump pad parts 100a, 100b, 100c and 100d. As the distance between the sense amplifiers and the channel bump pad parts 100a, 100b, 100c and 100d increases, the parasitic resistance between the sense amplifiers and the channel bump pad parts 100a, 100b, 100c and 100d may increase. Thus the sense amplifiers requiring relatively large power consumption may be located in marginal regions of the memory cell arrays 10a, 10b, 10c and 10d near the channel bump pad parts 100a, 100b, 100c and 100d.

The semiconductor die 90 may include first circuits CTRL 30a-30d and IO CTRL 40a-40d that control, independently per channel, the memory cell arrays 10a-10d, and second circuits COMM 51 and 52 that control commonly the memory cell arrays 10a-10d. For effective design of the semiconductor memory device 1000, each of the first circuits 30a-30d and 40a-40d may be disposed between a corresponding memory cell array and a corresponding channel bump pad part, and second circuits 51 and 52 may be disposed on both sides of the input-output bump pad part. In other words, first circuits 30a and 40a dedicated to first memory cell array 10a may be disposed between first memory cell array 10a and first channel bump pad part 100a, first circuits 30b and 40b dedicated to second memory cell array 10b may be disposed between second memory cell array 10b and second channel bump pad part 100b, first circuits 30c and 40c dedicated to third memory cell array 10c may be disposed between third memory cell array 10c and third channel bump pad part 100c, and first circuits 30d and 40d dedicated to fourth memory cell array 10d may be disposed between fourth memory cell array 10d and fourth channel bump pad part 100d.

As will be further described with reference to FIGS. 8A, 8B, 8C and 8D, second circuits 51 and 52 for controlling commonly memory cell arrays 10a, 10b, 10c and 10d may be disposed in other portions of semiconductor die 90 depending on design margin of semiconductor memory device 1000.

First circuits 30a-30d and 40a-40d for controlling independently per channel memory cell arrays 10a, 10b, 10c and 10d may include input-output control circuits IO CTRL 40a-40d and additional control circuits CTRL 30a-30d. Input-output control circuits 40a-40d may include pre-drivers, input buffers (that is, receivers), joint test action group (JTAG) boundary scan cell (BSC) circuitry, etc. Additional control circuits 30a-30d may include row access strobe (RAS) control logics, column access strobe (CAS) control logics, etc. Second circuits COMM 51 and 52 for controlling commonly the memory cell arrays 10a, 10b, 10c and 10d may include direct current (DC) control logics for providing reference voltages or reference signals, temperature-compensated self-refresh (TCSR) control logics, etc.

Each of input-output control circuits 40a, 40b, 40c and 40d may be disposed between a corresponding memory cell array 10a, 10b, 10c and 10d and a corresponding channel bump pad part 100a, 100b, 100c and 100d. For efficient signal routing, a row-directional length Lr of each input-output control circuit may be identical to or smaller than a row-directional length of a corresponding channel bump pad part. Each of the input-output control circuits 40a, 40b, 40c and 40d includes pre-drivers of the same number as the data bump pads in each of the channel bump pad parts 100a, 100b, 100c and 100d. If each input-output control circuit is not designed within the row-directional length of the corresponding channel bump pad part, wiring for signal routing becomes complicated and thus overall design of semiconductor memory device 1000 becomes difficult. Further descriptions of the spatial relation between input-output control circuits 40a, 40b, 40c and 40d and channel bump pad parts 100a, 100b, 100c and 100d will be given with reference to FIGS. 9A and 9B.

In some example embodiments, semiconductor memory device 1000 may further include a test pad part 310/320 for testing operations of semiconductor memory device 1000. A wafer test, etc. may be performed using test pad part 310/320 as illustrated in FIG. 1 instead of using the input-output bump pad part. In general, a front-end process is performed such that a plurality of memory devices having the same structure are integrated in one wafer, and then a back-end process is performed such that the integrated memory devices are cut off into distinct semiconductor dies and each semiconductor die is packaged. The test pad part 310/320 may used for the wafer test after the front-end process is completed and before semiconductor die 90 is cut away from the wafer.

As illustrated in FIG. 1, the input-output bump pad part comprising channel bump pad parts 100a, 100b, 100c and 100d may be disposed in the central region of semiconductor die 90 in a row direction along a horizontal center line HL of the semiconductor die 90, and test pad part 310/320 may be disposed in a column direction along a vertical center line VL of semiconductor die 90.

As will be further described with reference to FIGS. 7A, 7B, 7C and 7D, test pad part 310/320 may be disposed in other portions of semiconductor die 90 depending on design margin of semiconductor memory device 1000.

Memory cell arrays 10a, 10b, 10c and 10d, channel bump pad parts 100a, 100b, 100c and 100d, and/or some of peripheral circuits may be designed using mirror images. For example, once a particular layout is selected for first memory cell array 10a, first channel bump pad part 100a and first circuits 30a and 40a, the layout for second memory cell array 10b, second channel bump pad part 100b and first circuits 30b and 40b may be obtained by mirroring the layout for first memory cell array 10a, etc. such that the two layouts may be symmetric with respect to the vertical center line VL. In the same way, the layouts of third memory cell array 10c, third channel bump pad part 100c, fourth memory cell array 10d and fourth channel bump pad part 100d, etc. may be determined to be symmetric with respect to the horizontal center line HL. Alternatively, the layouts for the other channels may be obtained by shifting one designed channel. In that case, the bump pads in each of the channel bump pad parts 100a, 100b, 100c and 100d may be arranged identically to the bump pads in the other channel bump pad parts.

As such, once a layout for one channel is designed, the entire layout for the plurality of channels may be obtained by mirroring and/or shifting the designed layout for the one channel. In addition, semiconductor memory device 1000 has the input-output bump pad part formed in the central region of semiconductor die 90, and thus semiconductor memory device 1000 may be conveniently coupled to other devices or chips of various structures, or the layout may be easily modified depending on changes of manufacturing process.

Figure 2A:
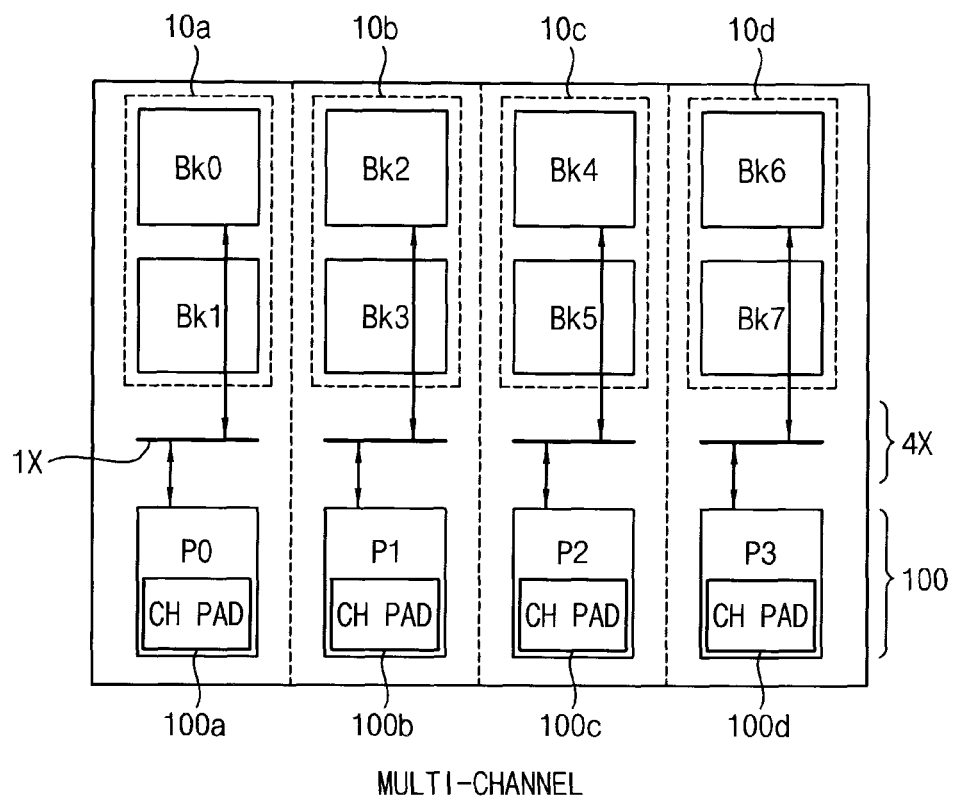
FIG. 2A is a diagram for describing a multi-channel interface adopted in the semiconductor memory device of FIG. 1.
Figure 2B:
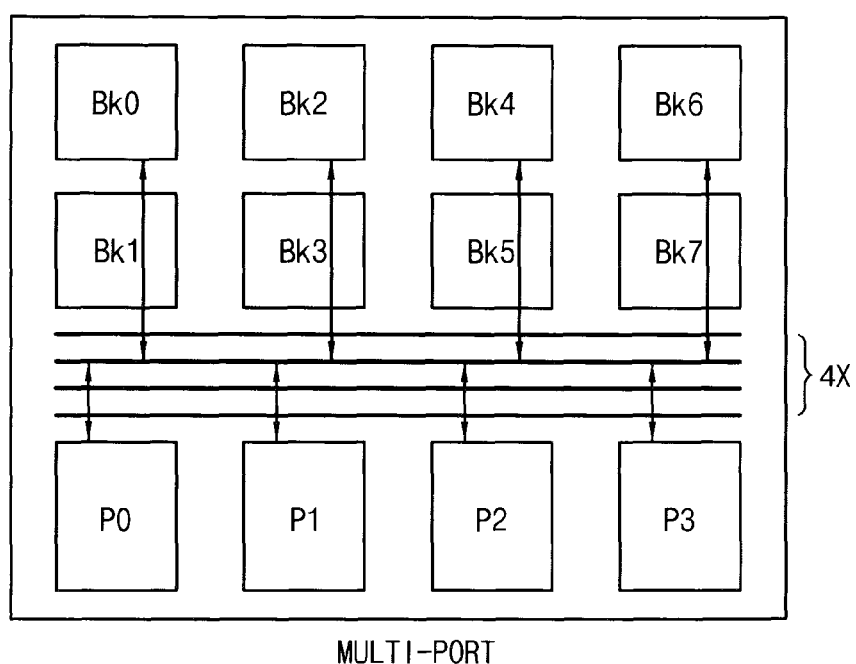
FIG. 2B illustrates a multi-port interface compared with the multi-channel interface of FIG. 2A.

FIG. 2A is a diagram for describing a multi-channel interface adopted in semiconductor memory device 1000 of FIG. 1, and FIG. 2B illustrates a multi-port interface compared with the multi-channel interface of FIG. 2A.

Referring to FIGS. 1 and 2A, each of the memory cell arrays 10a, 10b, 10c and 10d may include two memory banks, respectively. For example, the first memory cell array 10a includes a first memory bank Bk0 and a second memory bank Bk1. According to the multi-channel interface as illustrated in FIG. 2A, the four channel bump pad parts 100a, 100b, 100c and 100d of the input-output bump pad part, which are respectively included in the four ports P0, P1, P2 and P3, provide the plurality of channels (4×) for connecting each of the memory cell arrays 10a, 10b, 10c and 10d independently to one or more external devices, such as a memory controller. In other words, first port P0 is dedicated to first memory cell array 10a including first memory bank Bk0 and second memory bank Bk1, second port P1 is dedicated to second memory cell array 10b including third memory bank Bk2 and fourth memory bank Bk3, the third port P2 is dedicated to third memory cell array 10c including fifth memory bank Bk4 and sixth memory bank Bk5, and fourth port P3 is dedicated to fourth memory cell array 10d including seventh memory bank Bk6 and eighth memory bank Bk7.

Compared with the multi-channel interface of FIG. 2A, in the multi-port interface of FIG. 2B all the memory banks Bk0 through Bk7 are shared with respect to the plurality of the ports P0, P1, P2 and P3.

As the number of memory masters such as multi-core processors, hardware accelerators, etc., are increased in a system-on-chip (SoC), the probability of conflict between the shared ports of FIG. 2B is increased and thus additional means are required to prevent such conflict. In contrast, semiconductor memory device 1000 of FIG. 1 according to example embodiments adopts the multi-channel interface as illustrated in FIG. 2A, thereby realizing a smaller chip size and lower power consumption than the multi-port interface of FIG. 2B and reduced complexities of design and test. For example, compared with an LPDDR2 DRAM having 32 data pins that operates with a data rate of 800 Mbps per pin and a bandwidth of about 3.2 GB/s, the wide input-output semiconductor memory device 1000 of FIG. 1 may include 512 data pins to realize about 12.8 GB/s at a relatively smaller data rate of about 200 Mbps per pin. As such, the semiconductor memory device 1000 according to example embodiments may reduce power consumption according to an increase of operational frequency, and simultaneously support a processor of high performance.

Semiconductor memory device 1000 may perform different operations at the same time using the channels respectively dedicated to each of the memory cell arrays 10a, 10b, 10c and 10d. For example, a write operation may be performed with respect to first memory cell array 10a while a read operation is performed with respect to the second memory cell array 10b. Additionally, semiconductor memory device 1000 may set different values with respect to the respective channels. For example, the set values independent per channel may include mode register set (MRS) values for designating a column access strobe (CAS) latency, a burst length, a burst type, etc. and extended mode register set (EMRS) values for designating conditions for a driver strength (DS), a partial array self refresh (PASR), etc. Furthermore, semiconductor memory device 1000 may adopts function of deep power down (DPD) that is enabled independently per channel, and may adopt a plurality of interfaces such as single data rate (SDR), double data rate (DDR), DDR2, LPDDR2, with respect to the channels, respectively.

FIGS. 3A, 3B, 4A, 4B, 5A, 5B, 6A and 6B illustrate example embodiments of an input-output bump pad part in semiconductor memory device 1000 of FIG. 1.

In FIGS. 3A, 3B, 4A, 4B, 5A, 5B, 6A and 6B, each small rectangle indicates a unit pad area (UPA), each bump pad and each bump on the bump pad may be formed within the unit pad area. The rectangles represented by D indicate data bump pads for transferring input and output data, the rectangles represented by V indicate power bump pads for providing voltages such as power supply voltages, and the rectangles represented by A indicate address-command bump pads for receiving address signals and/or command signals. In some example embodiments, each of the channel bump pad parts 100a, 100b, 100c and 100d of FIG. 1 may include one or more dummy pads represented by N in FIGS. 3A, 3B, 4A, 4B, 5A, 5B, 6A and 6B. The dummy pads may be implemented such that pads are electrically disconnected from semiconductor die 90 (No Connection) and/or bumps on the pad are omitted (No Bump).

The power bump pads V may include one or more bump pads receiving a ground voltage, and one or more bump pads receiving at least one power supply voltage. For example, the power bump pads V may be classified into bump pads receiving voltages VDD and VSS used in the memory cell arrays, and bump pads receiving voltages VDDQ and VSSQ used in the peripheral circuits such as first circuits 30a-30d and 40a-40d and second circuits 51 and 52. The same power supply voltage (e.g., 1.8 V) may be applied with respect to all of the channels, or different power supply voltages (e.g., 1.2 V and 1.8 V) may be applied to the respective channels. Some of the power bump pads V may be used for other functions. For example, some of the power bump pads V may be data mask bump pads DQM.

The row-directional unit length UL1 and the column-directional unit length UL2 of the unit pad area may be identical to each other, or different from each other, depending on a design margin of semiconductor memory device 1000.

Figure 3A:
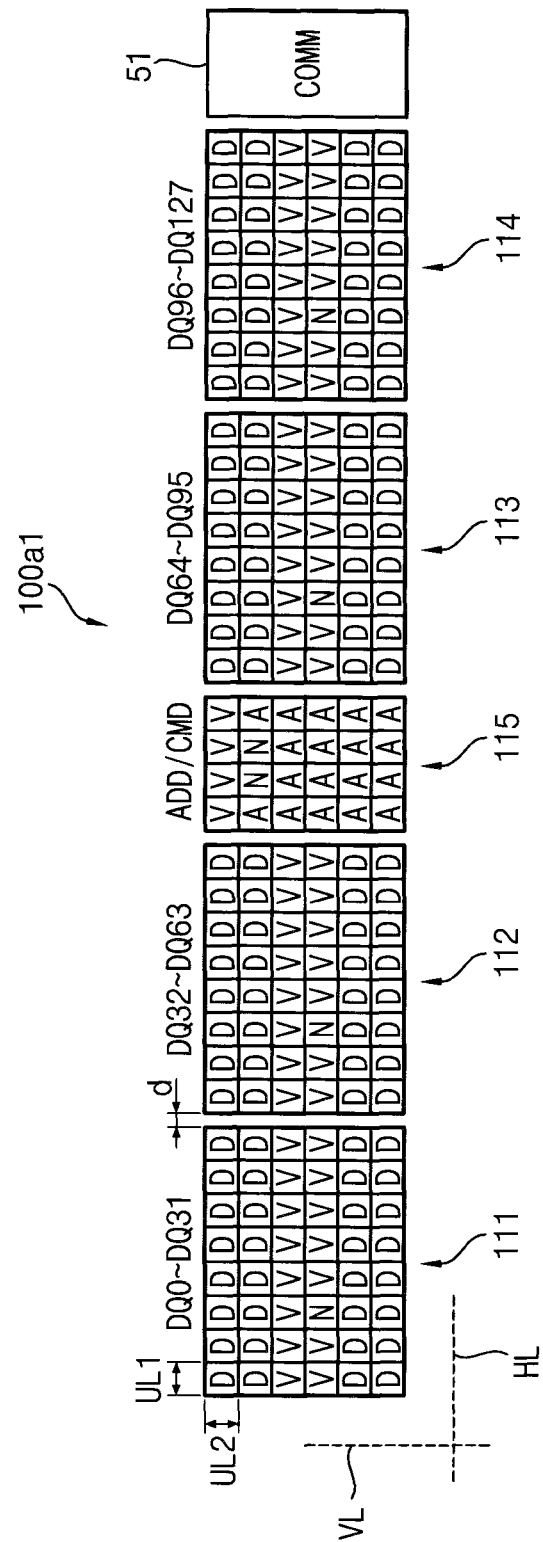
FIGS. 3A, 3B, 4A, 4B, 5A, 5B, 6A and 6B illustrate example embodiments of an input-output bump pad part in the semiconductor memory device of FIG. 1.

For convenience of illustration, only the examples of first channel bump pad part 100a of FIG. 1, which is located on the right side of the vertical center line VL of semiconductor die 90 and upper side of the horizontal center line HL of semiconductor die 90, are illustrated in FIGS. 3A, 3B, 4A, 4B, 5A, 5B, 6A and 6B. As mentioned above, the layouts of second channel bump pad part 100b, third channel bump pad part 100c and fourth channel bump pad part 100d may be determined by mirroring or shifting the layout of first channel bump pad part 100a. The above-described second circuits COMM 51 configured to control commonly first and fourth memory cell arrays 10a and 10d may be disposed on the right side of the first channel bump pad part 100a1 as illustrated in FIG. 3A.

Referring to FIG. 3A, each channel bump pad part 100a1 includes a plurality of bump pads that are arranged in an X*Y matrix of X rows and Y columns. As an example, FIG. 3A illustrates the channel bump pad part 100a1 in 6*36 matrix having 6 rows and 36 columns.

In some example embodiments, the channel bump pad part 100a1 may include an address-command pad block 115 of address-command bump pads A and a plurality of data pad blocks 111, 112, 113 and 114 of data bump pads D, arranged along a row direction. Two adjacent pad blocks may be separated from each other by an interval d. The address-command pad block 115 may be disposed between the data pad blocks 111, 112, 113 and 114. For example, the address-command pad block 115 may be disposed between the second data pad block 112 and the third data pad block 113 as illustrated in FIG. 3A.

Figure 4A:
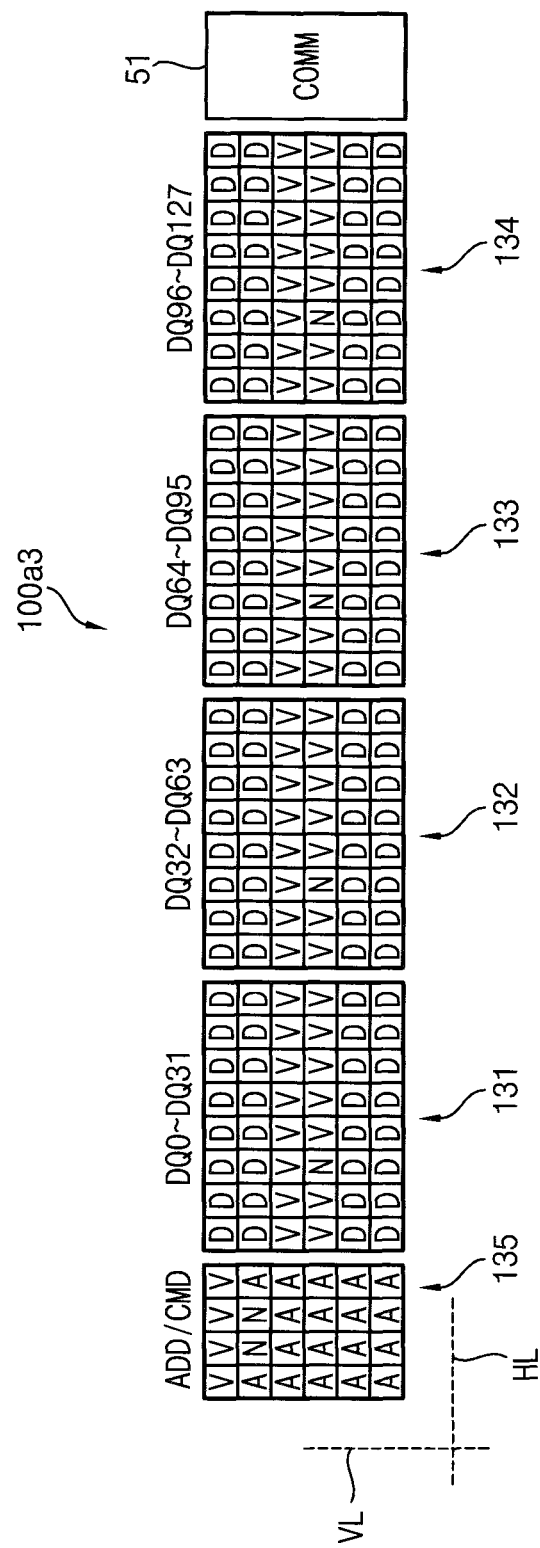
Figure 4B:
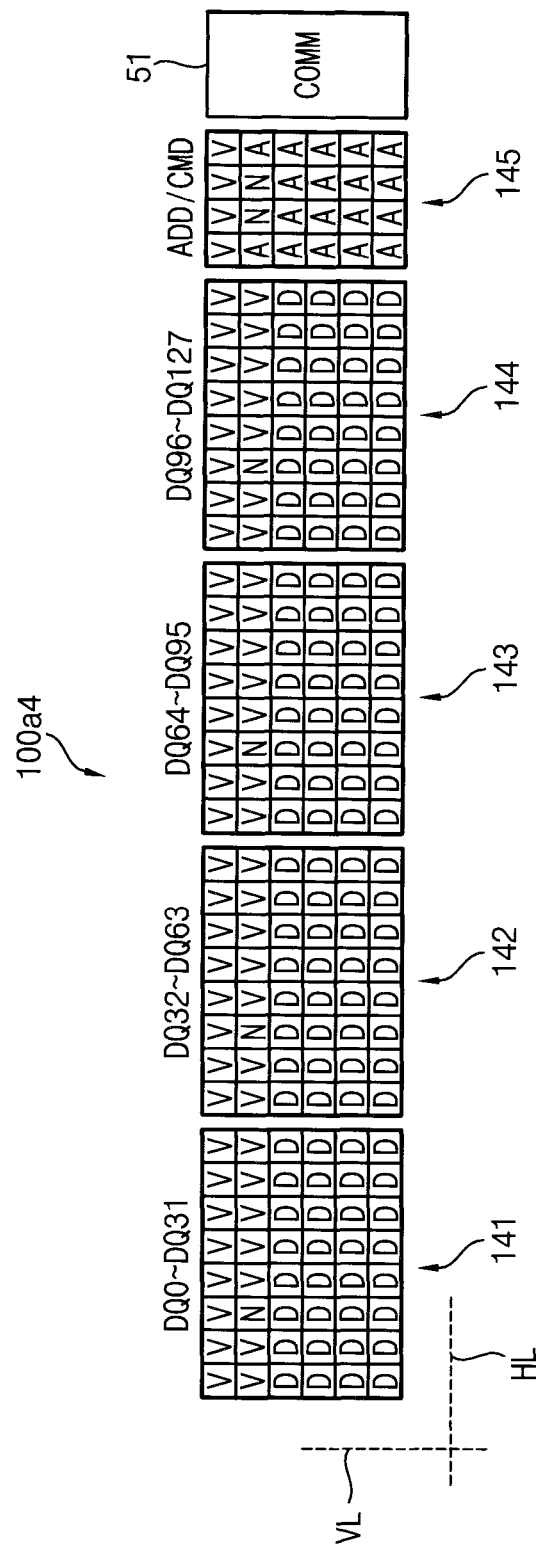

In other example embodiments as illustrated in FIG. 4A, the address-command pad block 135 included in the channel bump pad part 100a3 may be disposed at the left side of the plurality of the data pad blocks 131, 132, 133 and 134, or as illustrated in FIG. 4B the address-command pad block 145 included in the channel bump pad part 100a4 may be disposed at the right side of the plurality of the data pad blocks 141, 142, 143 and 144.

Figure 3B:
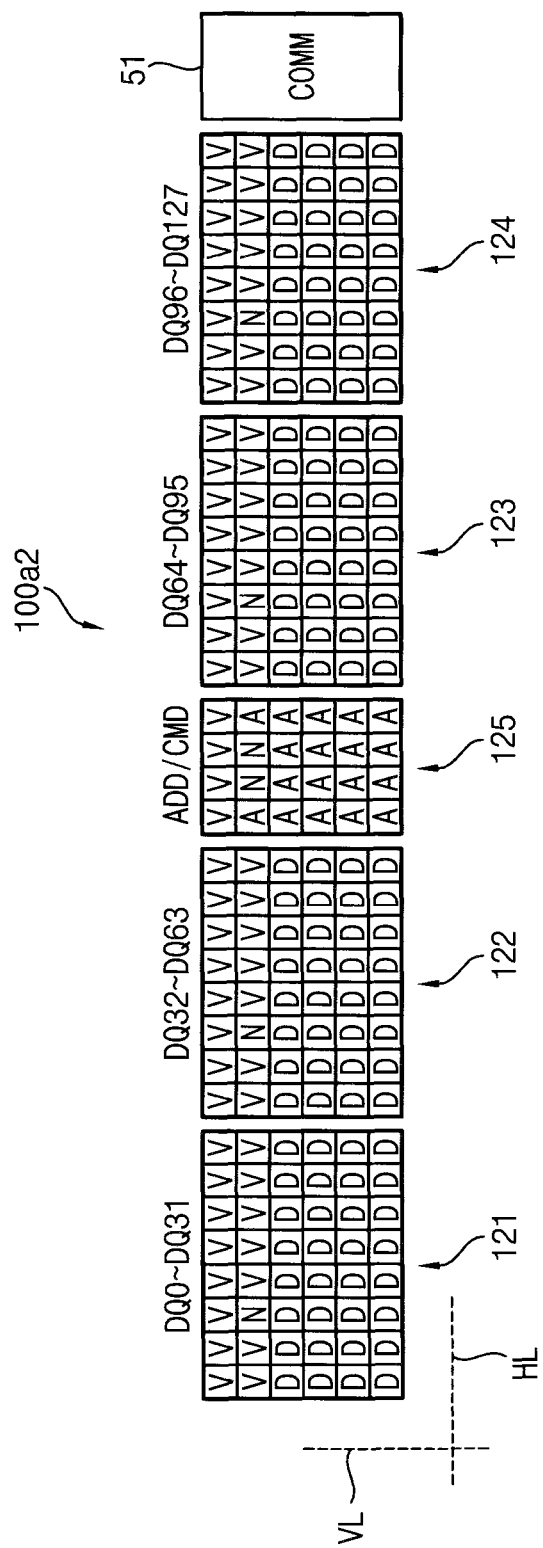

Referring back to FIG. 3A, the data pad blocks 111, 112, 113 and 114 and/or the address-command pad block 115 may include power bump pads V and dummy pads N. Each of the data pad blocks 111, 112, 113 and 114 may include at least one row of power bump pads V receiving power supply voltages. The at least one row of the power bump pads V may correspond to central rows or marginal (edge) rows in matrix arrangement. For example, the power bump pads V may be disposed at the third and fourth rows corresponding to the central rows as illustrated in FIG. 3A, or the power bump pads V may be disposed at the first and second rows corresponding to the marginal rows as illustrated in FIG. 3B. Alternatively, as illustrated in FIG. 6B the power bump pads V may be disposed in a central region of each of the data pad blocks 181, 182, 183 and 184, and the data bump pads D may be disposed to surround the power bump pads V.

Figure 5A:
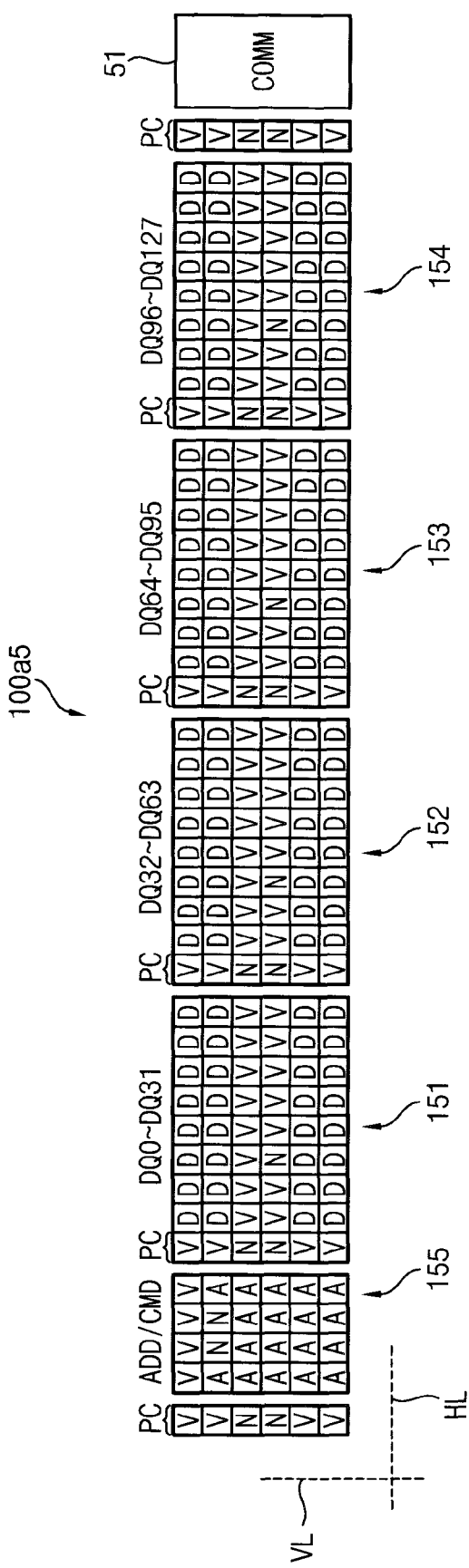
Figure 5B:
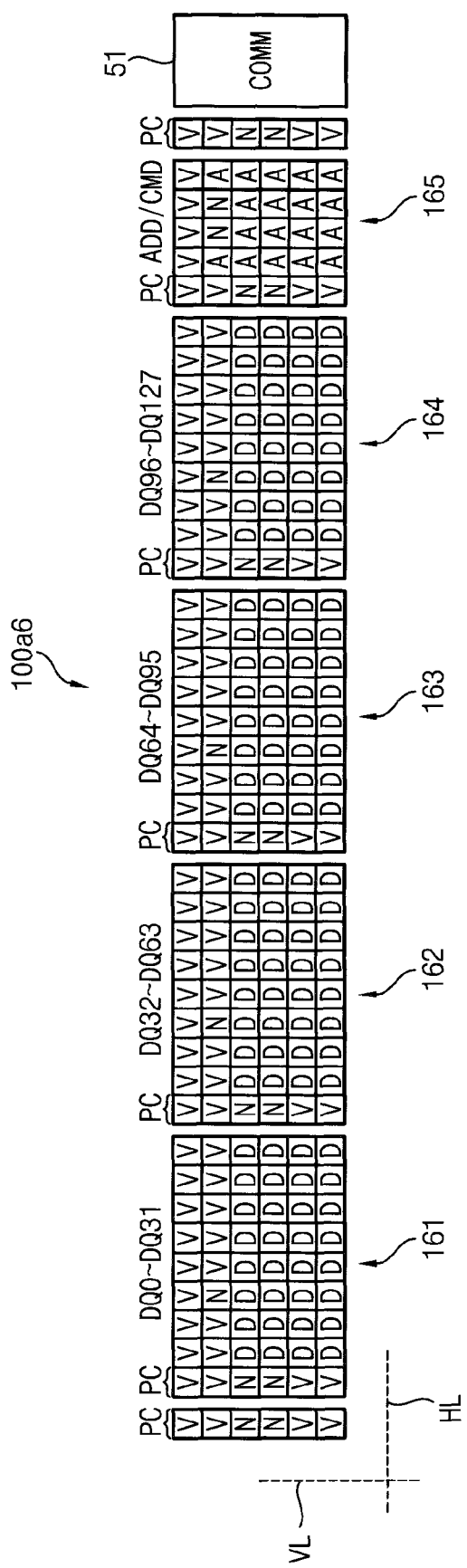

Referring to FIG. 5A, each of the data pad blocks 151, 152, 153 and 154 may include at least one power column PC of power bump pads V receiving one or more power supply voltages. A predetermined number of dummy pads N may be included in each power column PC. FIG. 5A illustrates an example embodiment of the channel bump pad part 100a5 in which the address-command pad block 155 is disposed at the left side of the plurality of data pad blocks 151, 152, 153 and 154, and the power bump pads V are disposed at the third and fourth rows corresponding to central rows, whereas FIG. 5B illustrates an example embodiment of the channel bump pad part 100a6 in which the address-command pad block 165 is disposed at the right side of the plurality of data pad blocks 161, 162, 163 and 164 and the power bump pads V are disposed at the first and second rows corresponding to marginal (edge) rows. The channel bump pad parts 100a5 and 100a6 also include a number of power columns PC.

Figure 6A:
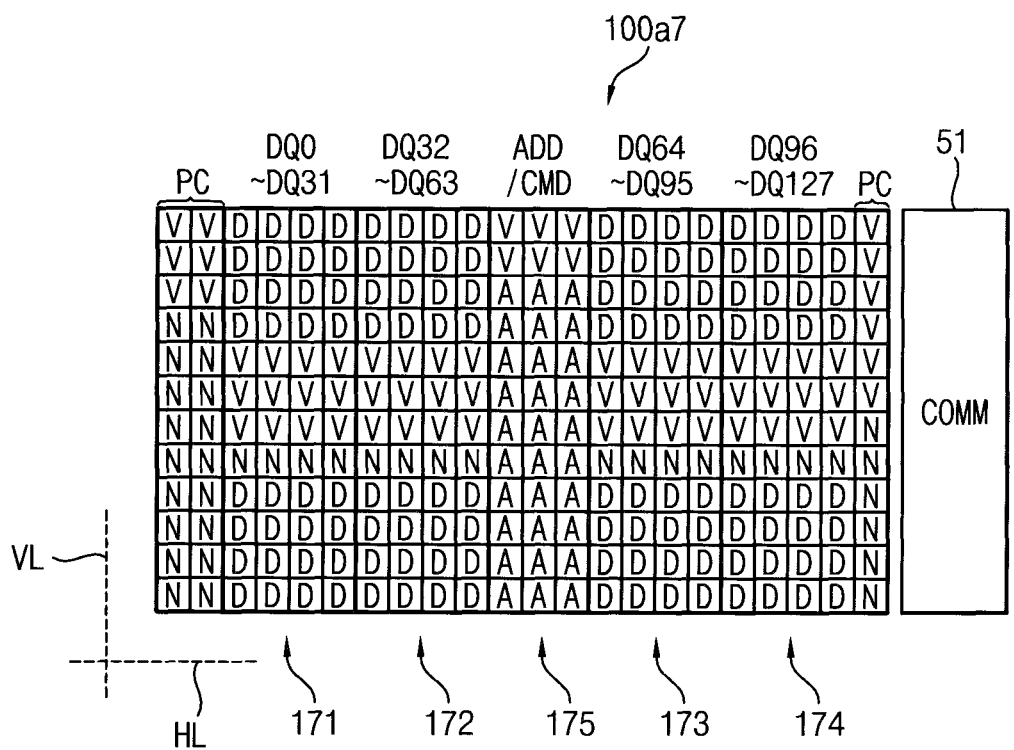
Figure 6B:
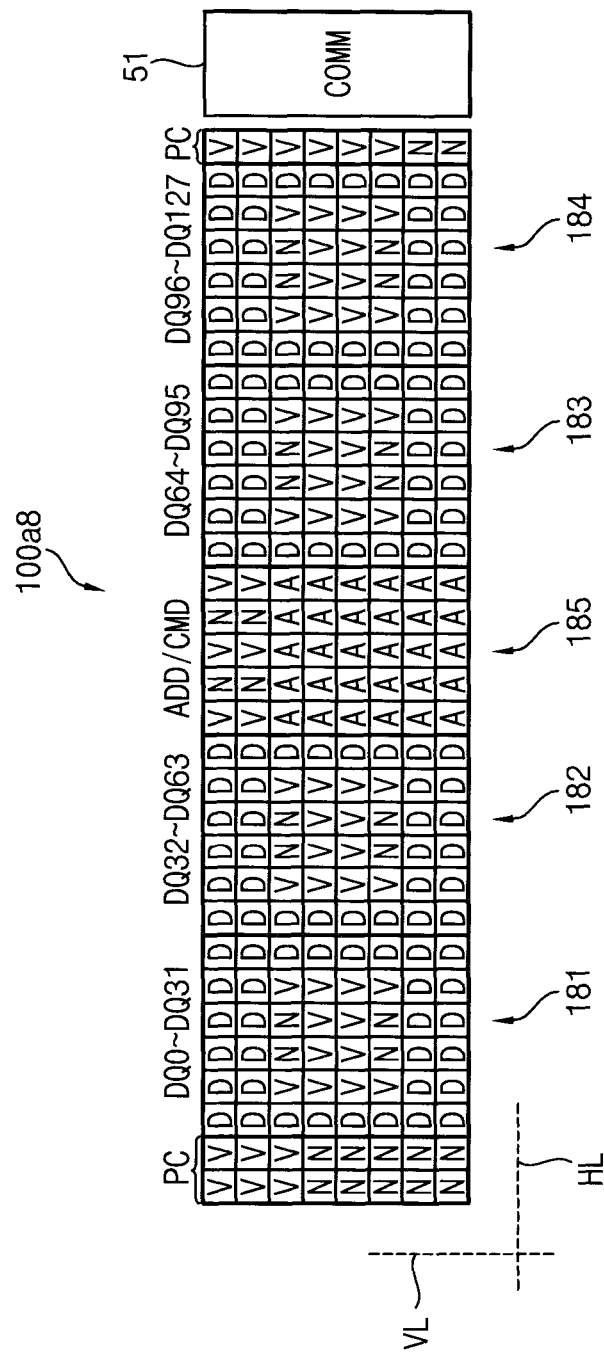

Referring to FIGS. 6A and 6B, the number of rows and the number of columns in the matrix arrangement of each channel bump pad part may be determined appropriately depending on the design margin of the semiconductor memory device. Both channel bump pad part 100a7 of FIG. 6A, and channel bump pad part 100a8 of FIG. 6B, include 128 data bump pads D corresponding to 128 DQ pins DQ0 through DQ127, whereas the number of power bump pads V and the number of dummy pads N may be altered. FIG. 6A illustrates an example embodiment of the channel bump pad part 100a7 in the form of a 12*22 matrix, and FIG. 6B illustrates an example embodiment of the channel bump pad part 100a8 in the form of an 8*32 matrix. If row-directional margin is insufficient for the entire layout of the semiconductor memory device, the layout of FIG. 6B may be selected instead of the layout of FIG. 6A.

Hereinafter, example embodiments associated with the test pad part and the second circuits will be described with reference to FIGS. 7A, 7B, 7C, 7D, 8A, 8B, 8C and 8D, omitting the repeated descriptions related with FIG. 1.

FIGS. 7A, 7B, 7C and 7D illustrate example embodiments with respect to dispositions of a test pad part in a semiconductor memory device.

As described with reference to FIG. 1, the plurality of channel bump pad parts 100a, 100b, 100c and 100d may be disposed in a central region of semiconductor die 90 in the row direction along the horizontal center line HL, whereas test pad part 310/320 may be disposed in the column direction along the vertical center line VL of semiconductor die 90.

Depending on the entire layout margin of the semiconductor memory device, test pad part 310/320 may be disposed in other portions of semiconductor die 90. For example, the test pad part may be disposed in the row direction along the horizontal center line HL of semiconductor die 90.

Figure 7A:
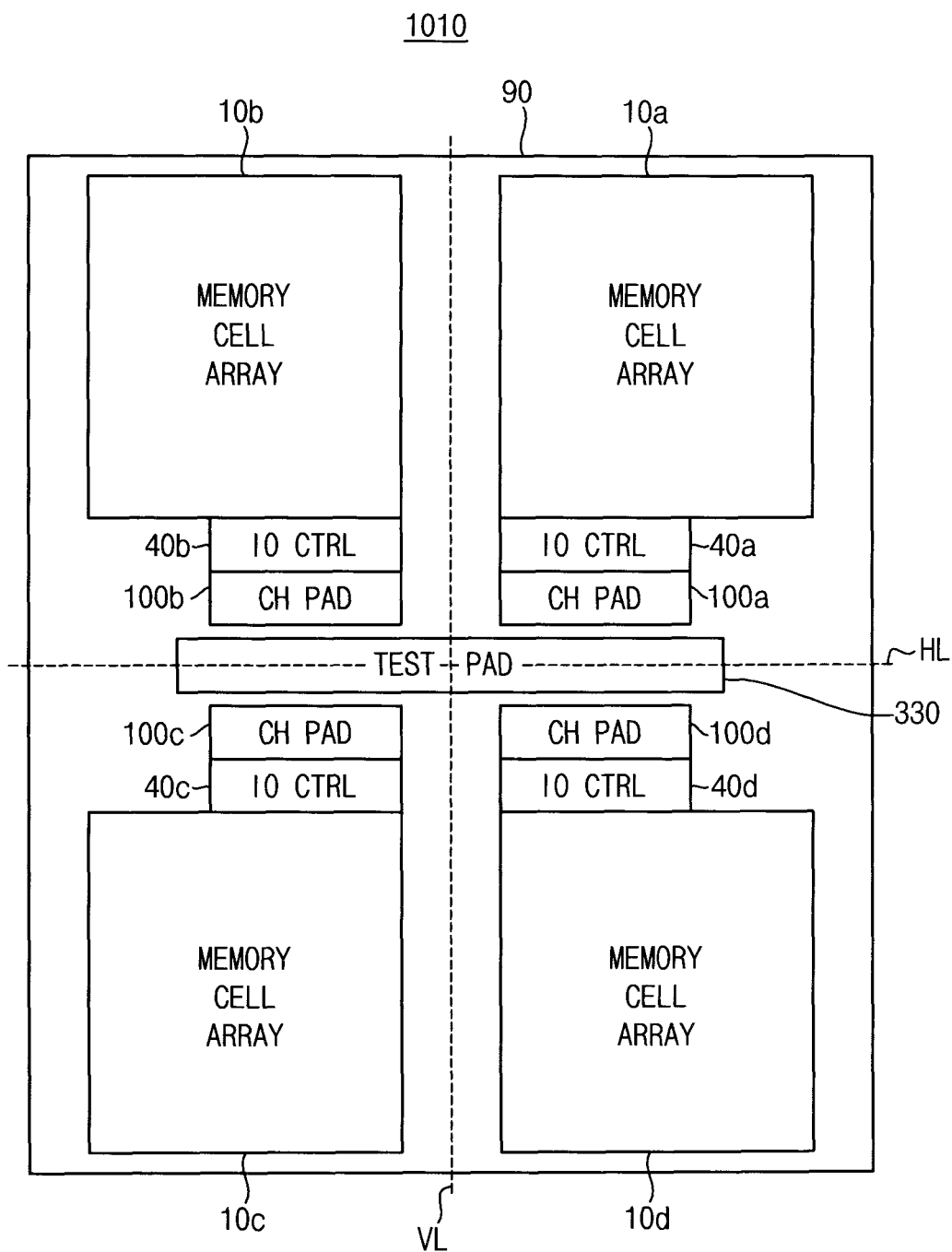
FIGS. 7A, 7B, 7C and 7D illustrate example embodiments with respect to dispositions of a test pad part in a semiconductor memory device.
Figure 7B:
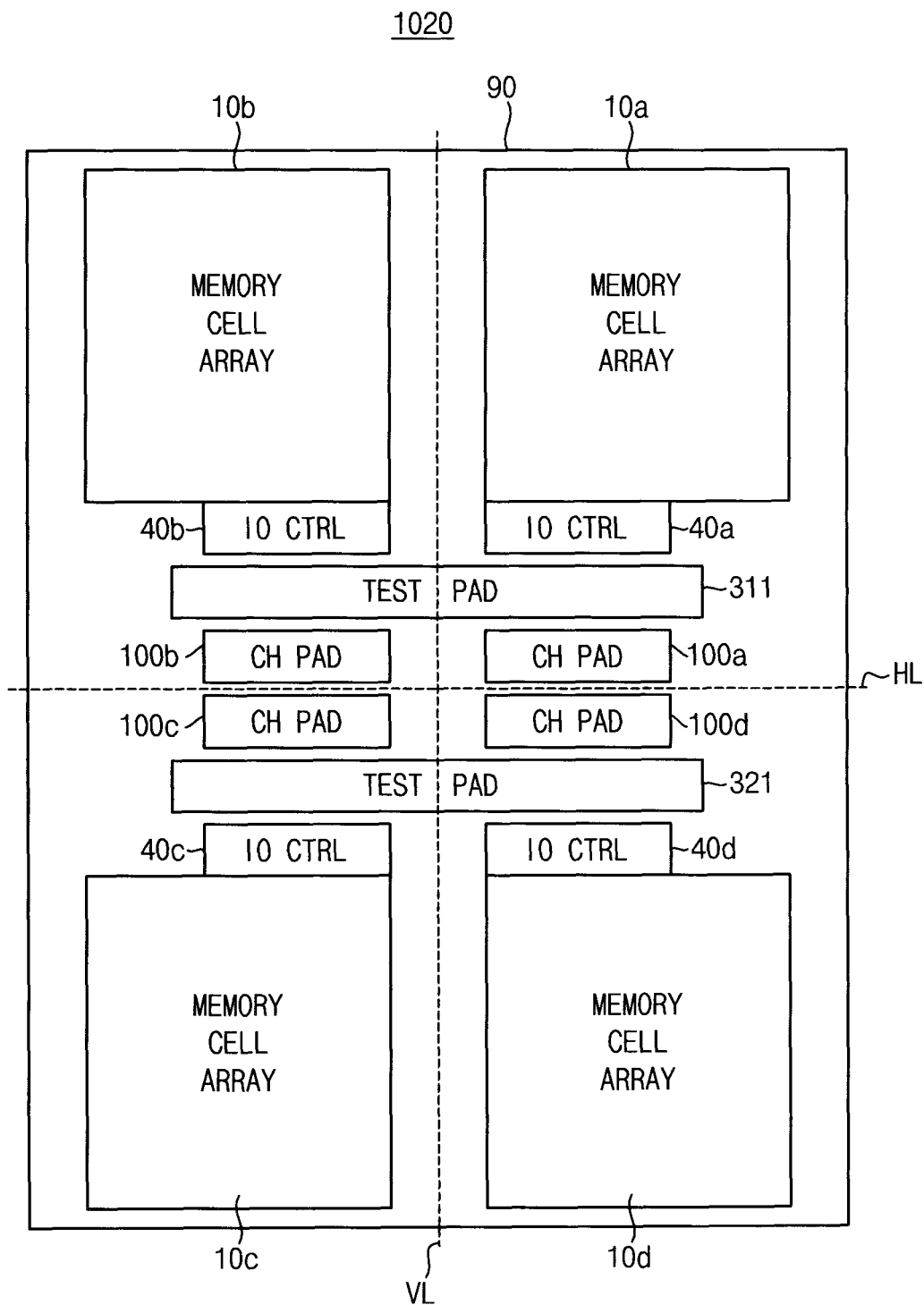

FIG. 7A illustrates an example embodiment of a semiconductor memory device 1010 in which the test pad part 330 is disposed in the row direction between upper channel bump pad parts 100a and 100b, and lower channel bump pad parts 100c and 100d. FIG. 7B illustrates an example embodiment of the semiconductor memory device 1020 in which a test pad part 311/321 is disposed in the row direction between channel bump pad parts 100a, 100b, 100c and 100d and input-output control circuits 40a, 40b, 40c and 40d.

Figure 7C:
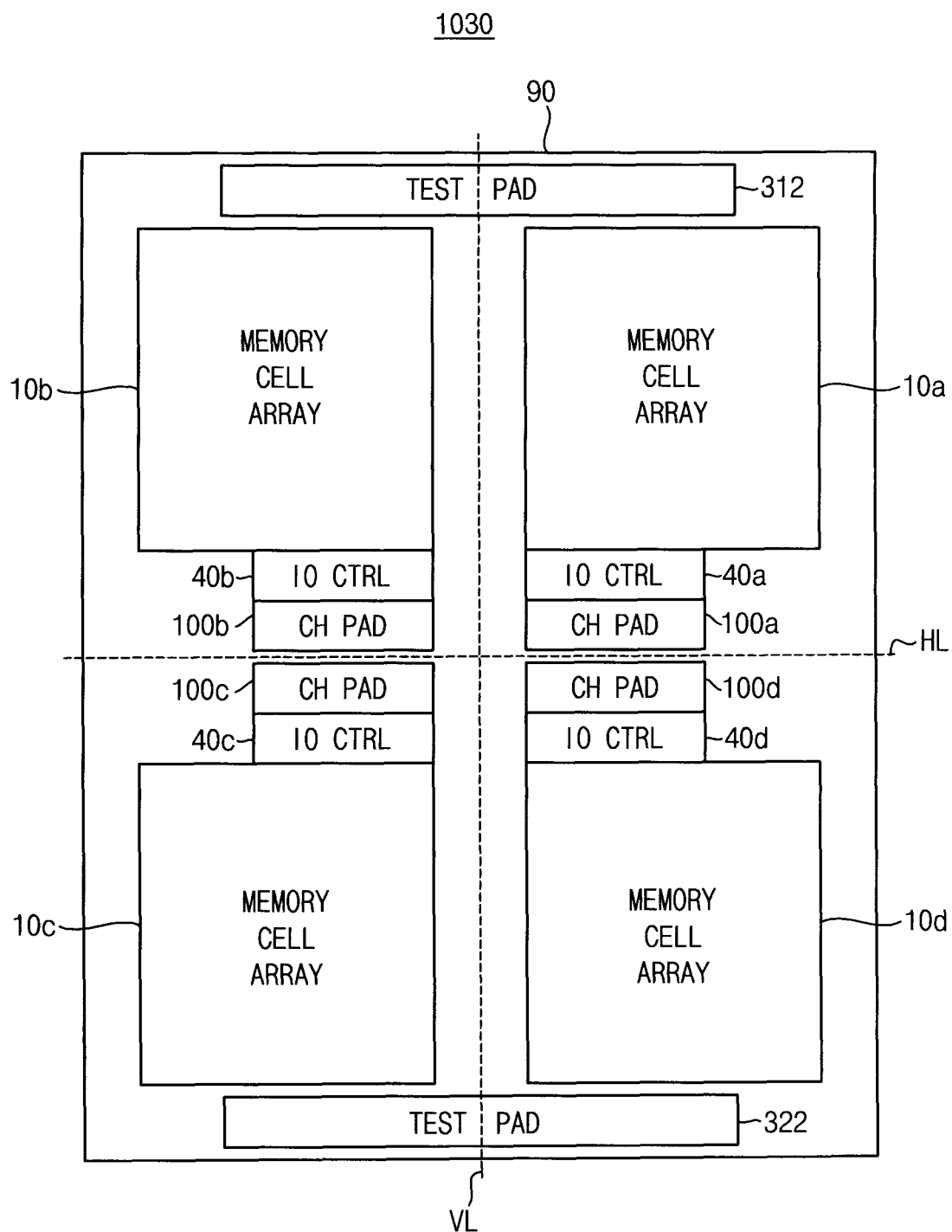
Figure 7D:
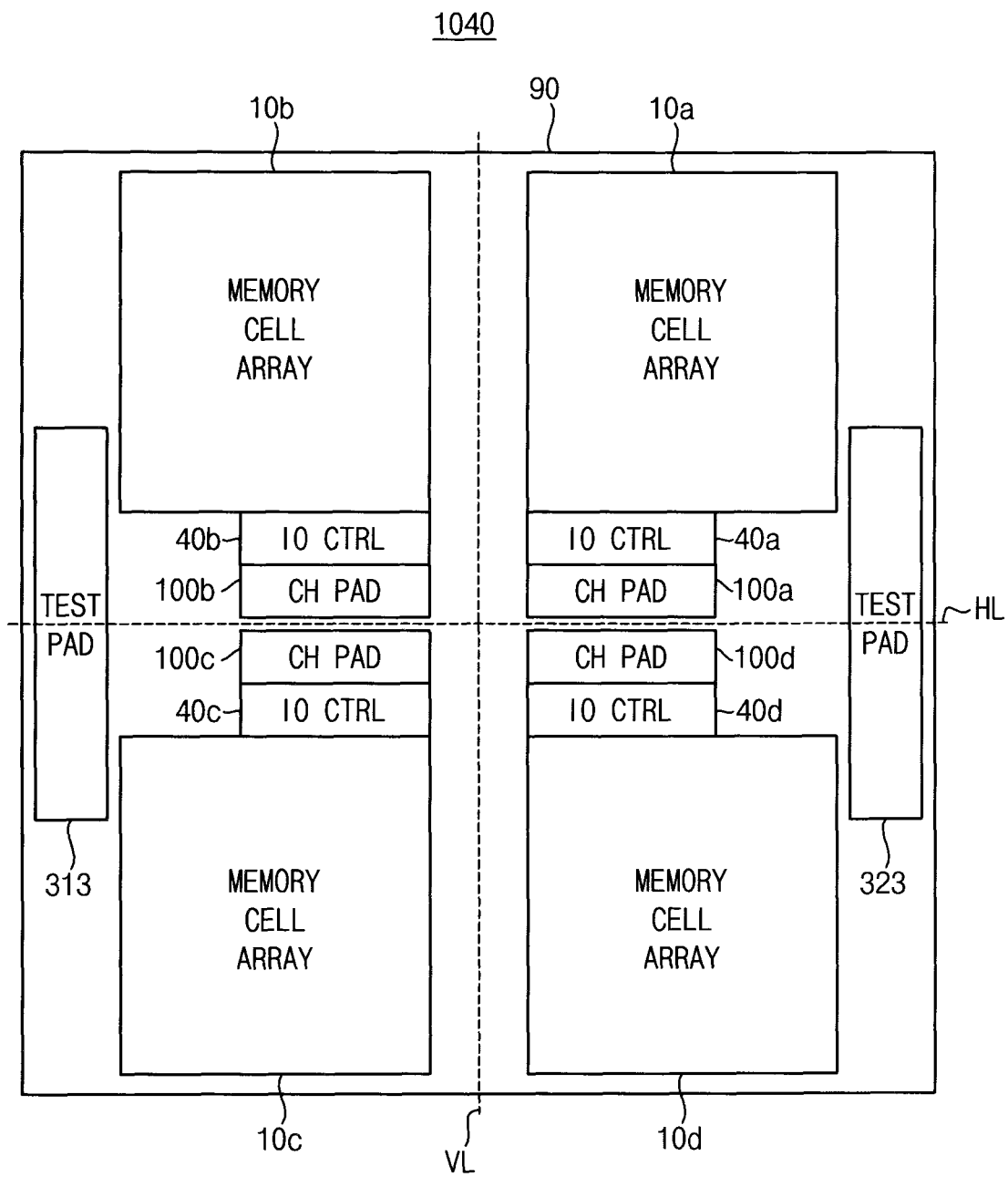

In some example embodiments, the test pad part may be disposed adjacent to the sides of semiconductor die 90. FIG. 7C illustrates an example embodiment of a semiconductor memory device 1030 in which a test pad part 312/322 is disposed in the row direction adjacent to upper and bottom sides of semiconductor die 90, and FIG. 7D illustrates an example embodiment of a semiconductor memory device 1040 in which the test pad part 313/323 is disposed in the column direction adjacent to left and right sides of semiconductor die 90.

FIGS. 8A, 8B, 8C and 8D illustrate example embodiments with respect to dispositions of second circuits in a semiconductor memory device.

As described with reference to FIG. 1, second circuits 51 and 52 for controlling commonly memory cell arrays 10a, 10b, 10c and 10d may be disposed at both sides of the input-output bump pad part (that is, the channel bump pad parts 100a, 100b, 100c and 100d).

Figure 8A:
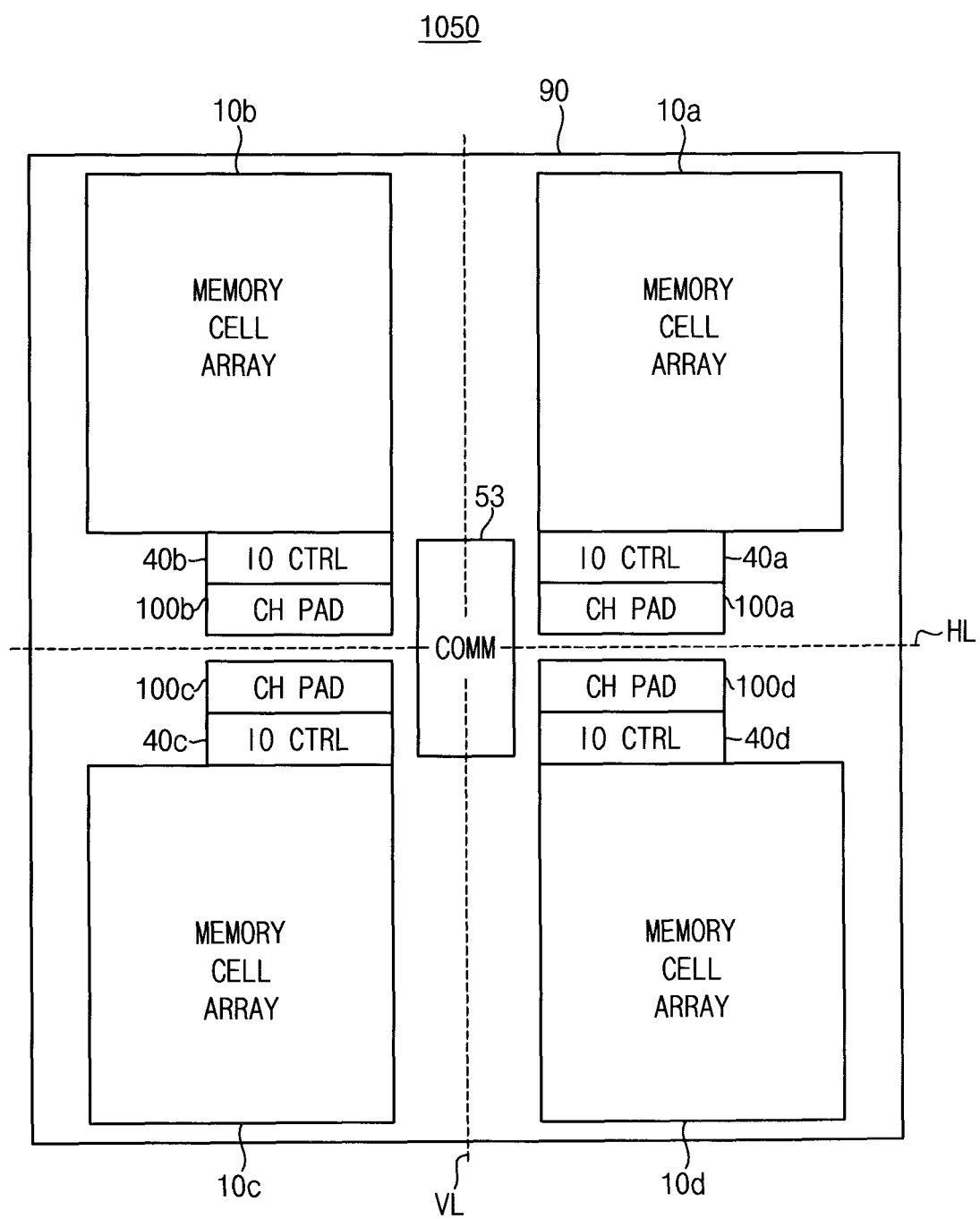
FIGS. 8A, 8B, 8C and 8D illustrate example embodiments with respect to dispositions of second circuits in a semiconductor memory device.
Figure 8B:
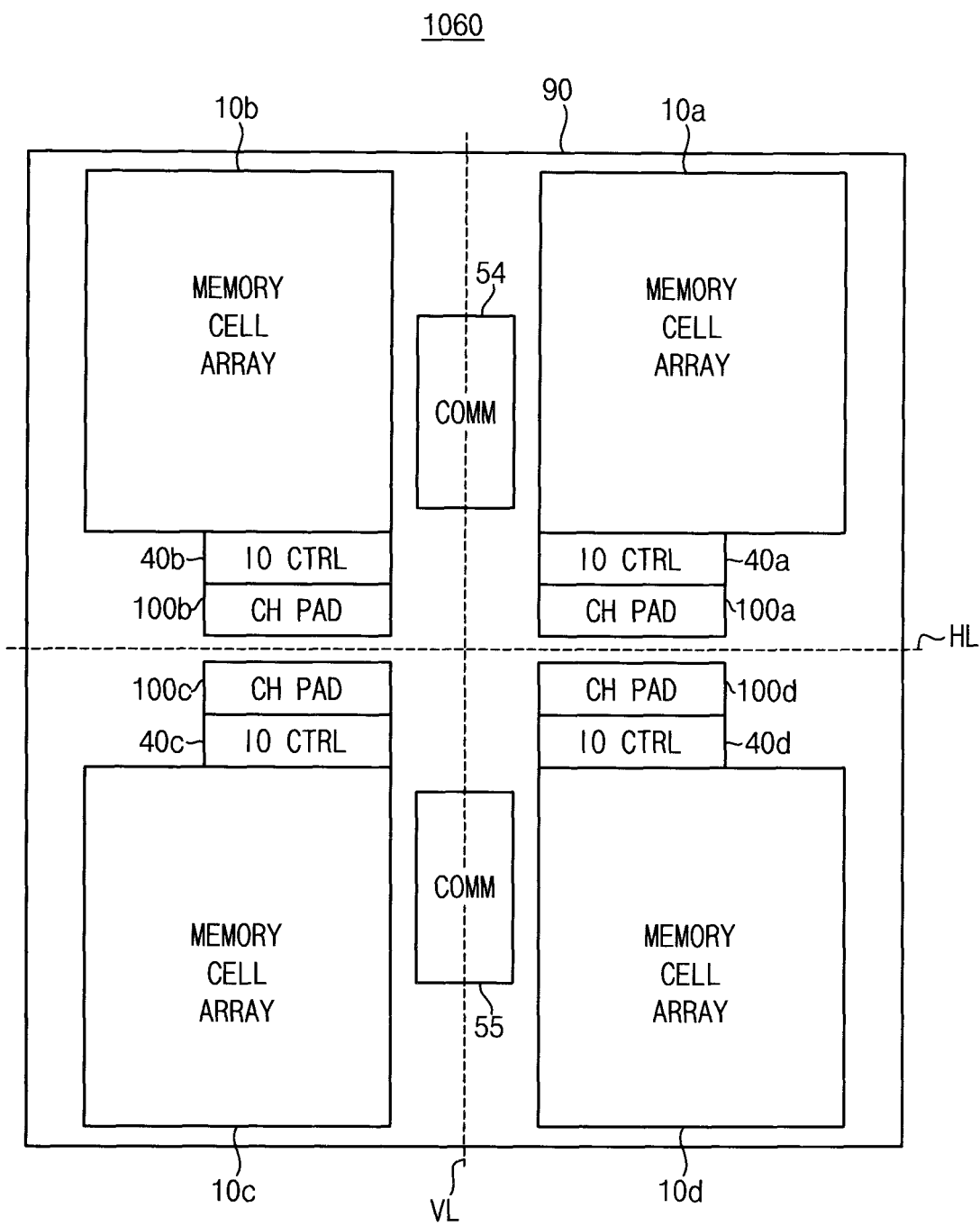

Depending on the entire layout margin of the semiconductor memory device, the second circuits may be disposed in other portions of semiconductor die 90. For example, the second circuits may be disposed along the vertical center line VL of semiconductor die 90. FIG. 8A illustrates an example embodiment of a semiconductor memory device 1050 in which second circuits 53 are disposed along the vertical center line VL of semiconductor die 90 between left channel bump pad parts 100b and 100c, and right channel bump pad parts 100a and 100d. FIG. 8B illustrates an example embodiment of semiconductor memory device 1060 in which second circuits 54 and 55 are disposed along the vertical center line VL of semiconductor die 90 between left memory cell arrays 10b and 10c and right memory cell arrays 10a and 10d.

Figure 8C:
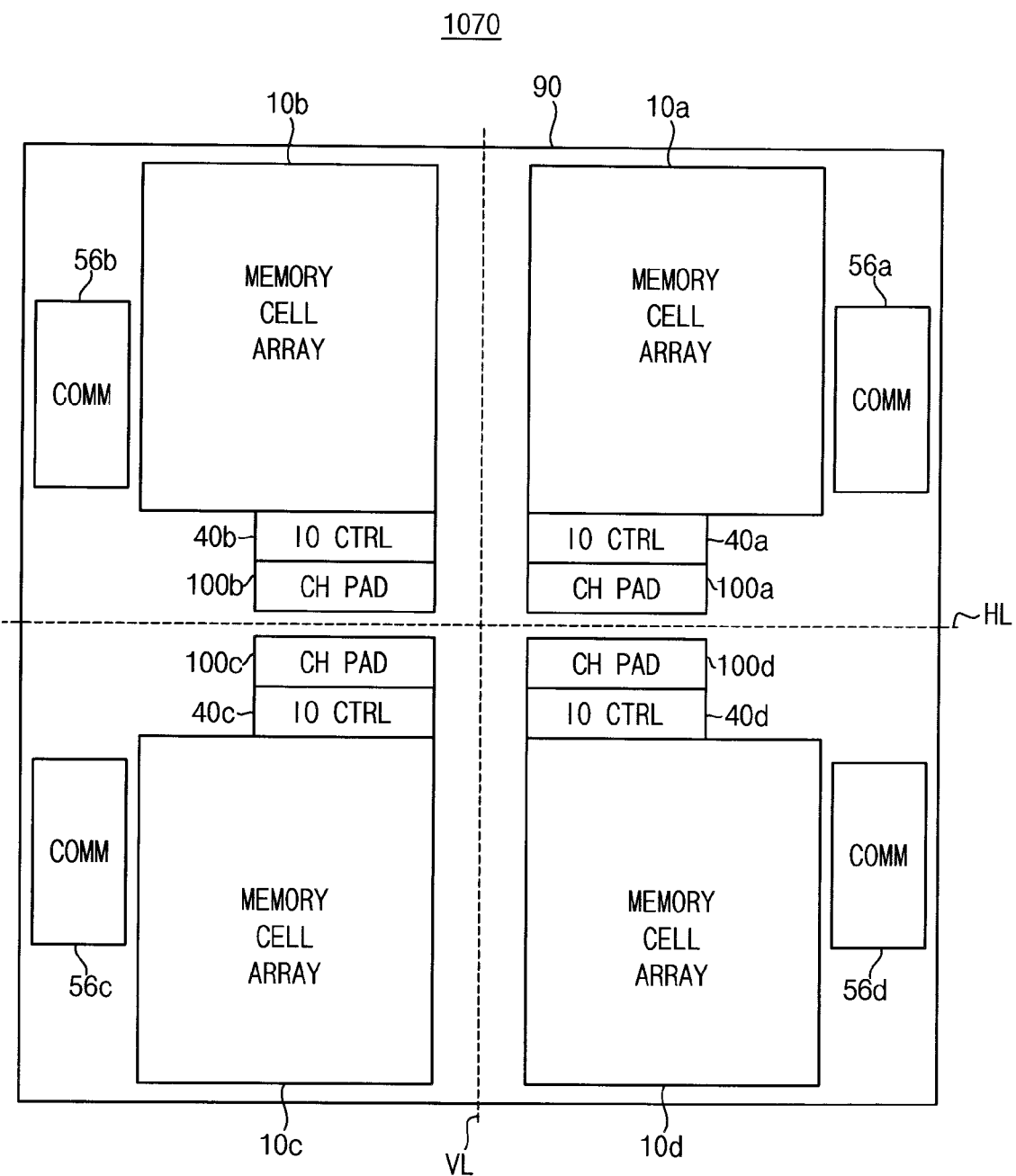
Figure 8D:
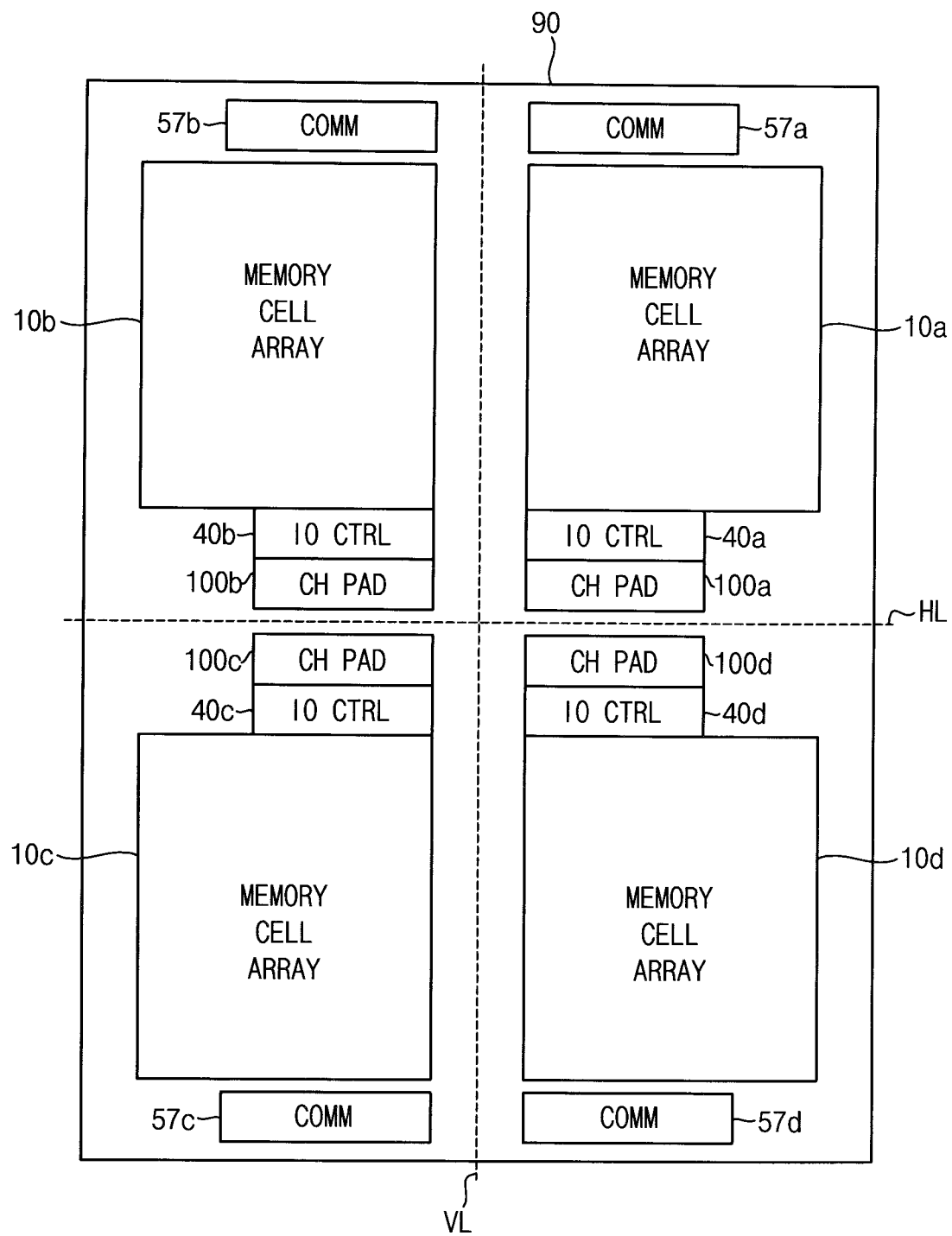

In some example embodiments, the second circuits may be disposed adjacent to the sides of semiconductor die 90. FIG. 8C illustrates an example embodiment of a semiconductor memory device 1070 in which second circuits 56a, 56b, 56c and 56d are disposed adjacent to the left and right sides of semiconductor die 90. FIG. 8D illustrates an example embodiment of a semiconductor memory device 1080 in which second circuits 57a, 57b, 57c and 57d are disposed adjacent to the upper and bottom sides of semiconductor die 90.

Figure 9A:
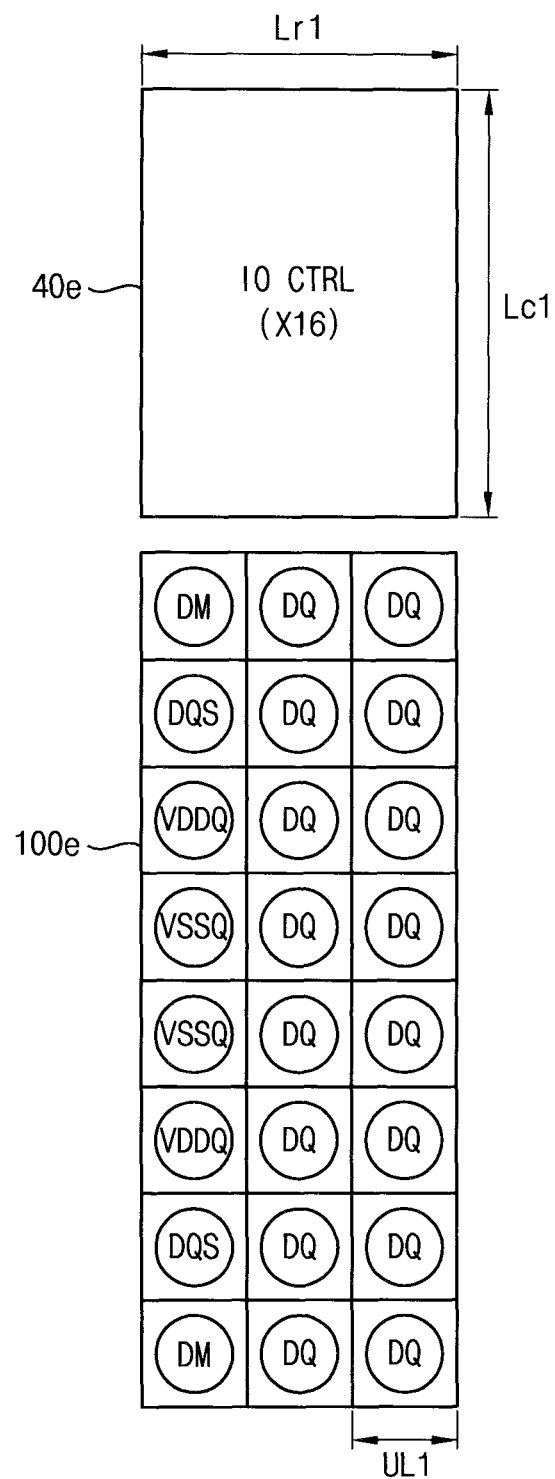
FIGS. 9A and 9B are diagrams for describing a relationship between an input-output control circuit and a channel bump pad part.
Figure 9B:
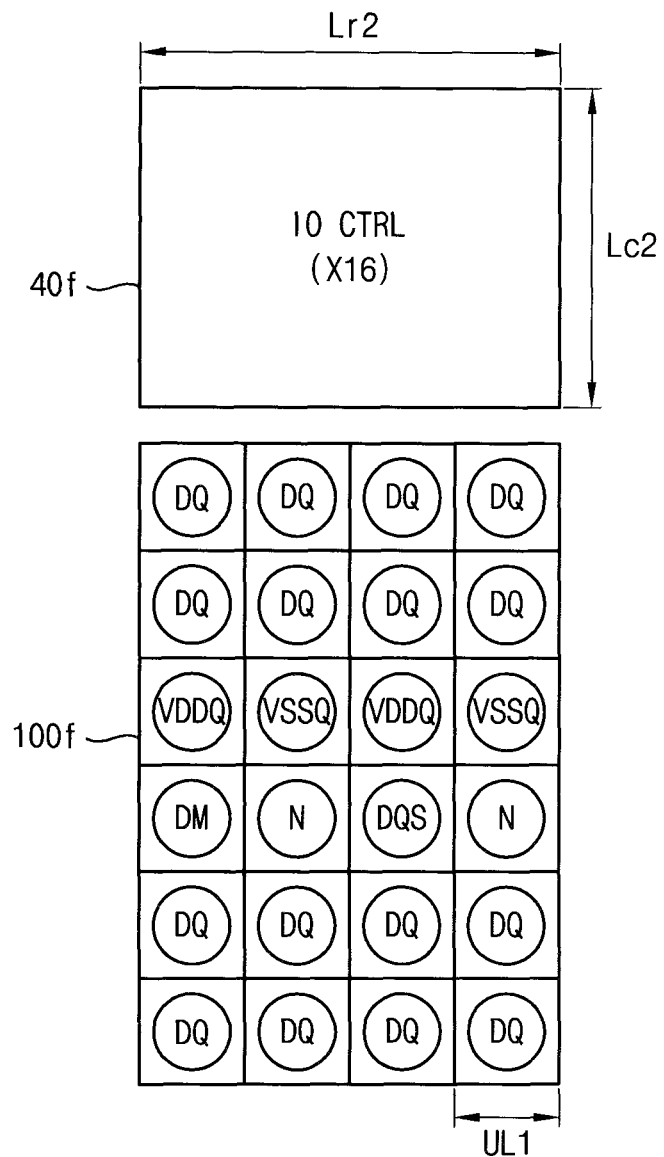

FIGS. 9A and 9B are diagrams for describing a relationship between an input-output control circuit and a channel bump pad part.

For efficient signal routing as described with reference to FIG. 1, a row-directional length Lr of each input-output control circuit may be identical to or smaller than a row-directional length of each channel bump pad part. Each of the input-output control circuits 40a, 40b, 40c and 40d includes pre-drivers of the same number as the data bump pads in each of the channel bump pad parts 100a, 100b, 100c and 100d. If each input-output control circuit is not designed within the row-directional length of the corresponding channel bump pad part, wiring for signal routing becomes complicated and thus overall design of the semiconductor memory device becomes difficult.

Referring to FIG. 9A, a channel bump pad part 100e includes sixteen data bump pads DQ in an 8*3 matrix and thus a corresponding input-output control circuit 40e includes sixteen pre-drivers, etc. within the row-directional length Lr1 (that is, 3*UL1) of the channel bump pad part 100e. Referring to FIG. 9B, a channel bump pad part 100f includes sixteen data bump pads DQ in a 6*4 matrix and thus a corresponding input-output control circuit 40f includes sixteen pre-drivers, etc. within the row-directional length Lr2 (that is, 4*UL1) of channel bump pad part 100f. If it is assumed that the size of the unit pad area in channel bump pad part 100e in FIG. 9A is identical to the size of the unit pad area in channel bump pad part 100f in FIG. 9B, input-output control circuit 40f in FIG. 9B may be designed to have the row-directional length Lr2 greater than the row-directional length Lr1 of input-output control circuit 40e in FIG. 9A, and/or input-output control circuit 40f in FIG. 9B may be designed to have the column-directional length Lc2 smaller than the column-directional length Lc1 of input-output control circuit 40e in FIG. 9A.

An output driver and an input buffer are associated with each data bump pad DQ. The output driver and/or the input buffer may be included in input-output control circuit 40e or in channel bump pad part 100e. As such, the size UL1 and UL2 of the unit pad area, the number of rows and columns in each channel bump pad part and the size Lr and Lc of the input output control circuit may be determined, considering the entire layout margin of semiconductor memory device 1000 of FIG. 1, such that the output drivers and the input buffers corresponding to the number of data bump pads may be distributed in the input-output control circuit and the channel bump pad part.

Even though it is more advantageous as the number of power pad pairs VDDQ and VSSQ is increased, the number of power pad pairs VDDQ and VSSQ may be limited according to the layout margin. FIGS. 9A and 9B illustrate example embodiments in which one pair of the power supply voltage pad VDDQ and the ground voltage pad VSSQ is included. In FIGS. 9A and 9B, DM represents data mask pads, N represents dummy pads and DQS represents data strobe pads.

Figure 10:
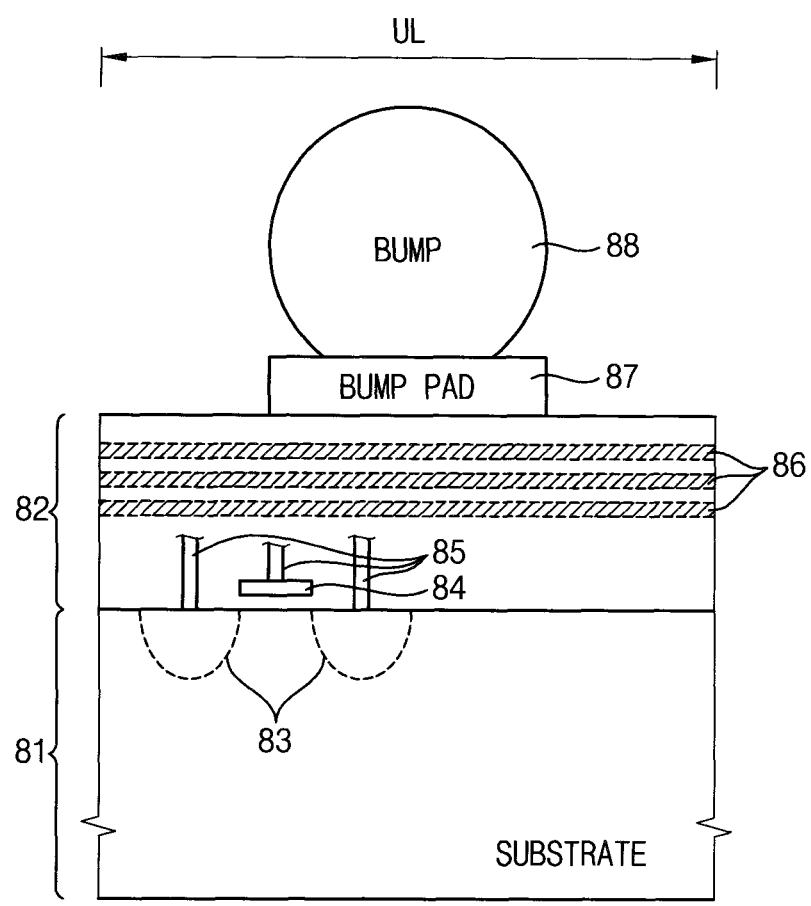
FIG. 10 is a cross-sectional view of a unit pad area.

FIG. 10 is a cross-sectional view of a unit pad area. FIG. 10 schematically illustrates the vertical structure of a substrate region 81, an upper region 82, a bump pad 87 and a conductive bump 88, with respect to a unit length UL of a unit pad area. The structural elements shown in FIG. 10 may be formed using semiconductor processes such as depositing, etching, doping, patterning, sputtering, etc.

Active regions 83 for a source and a drain of a transistor may be formed in the upper portion of the substrate region through ion-implanting process, and a gate 84 of the transistor may be formed in upper region 82. Passive elements such as a MOS capacitor, as well as the active elements such as the transistor 83/84, may be formed in substrate region 81 and upper region 82. Upper region 82 may include metal layers 86 in which metal lines for signal routing and power supply are formed. The electrodes of transistor 83/84, the metal lines in the metal layers 86, and the bump pad 87 may be electrically coupled through inter-layer connections 85 such as via holes. Conductive bump 88 may be formed on bump pad 87 using a ball-drop process, screen printing process, etc. The electrical contact between conductive bump 88 and bump pad 87 may be enhanced by reflowing conductive bump 88 over a melting point.

Figure 11A:
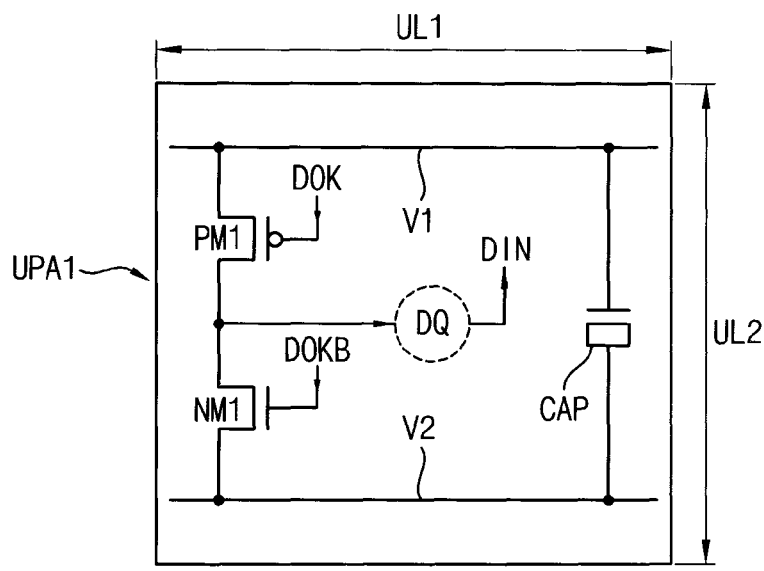
FIGS. 11A, 11B, 12, 13A, 13B and 14 are circuit diagrams illustrating example embodiments of a unit pad area.
Figure 11B:
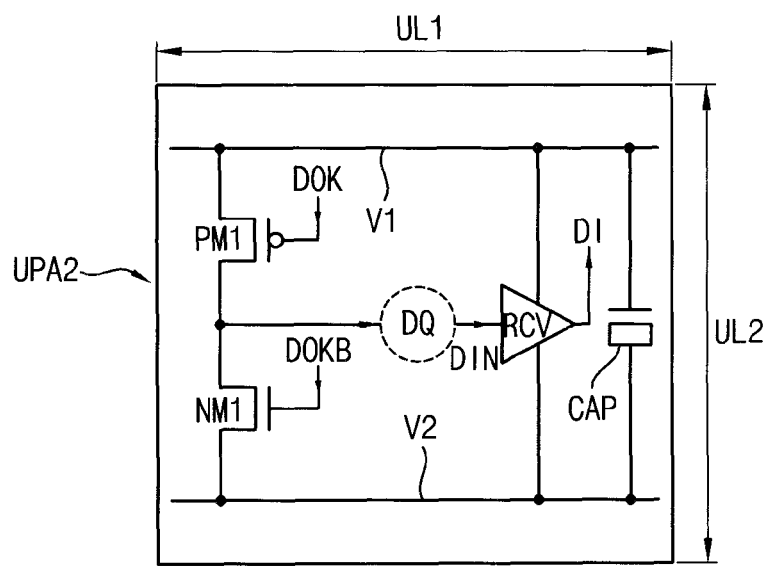
Figure 12:
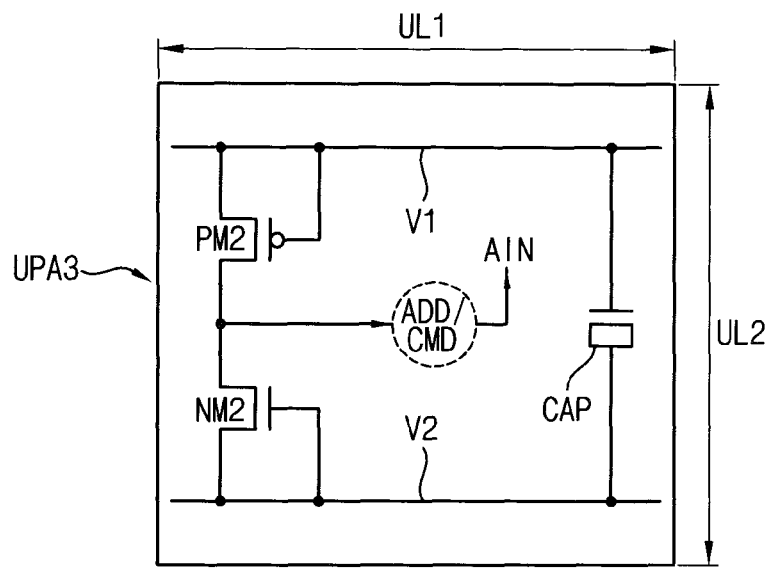
Figure 13A:
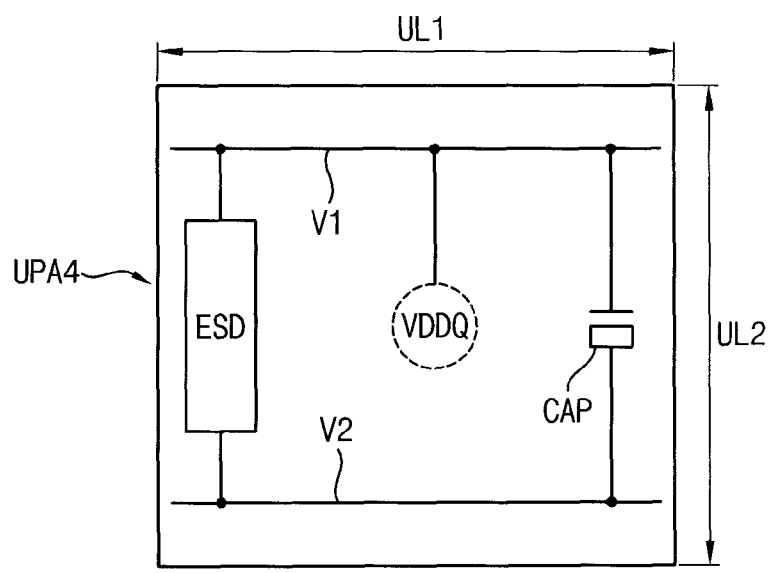
Figure 13B:
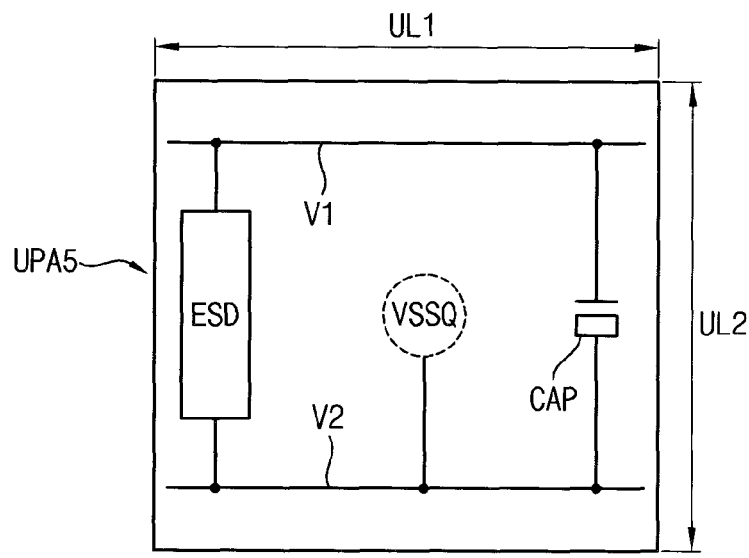
Figure 14:
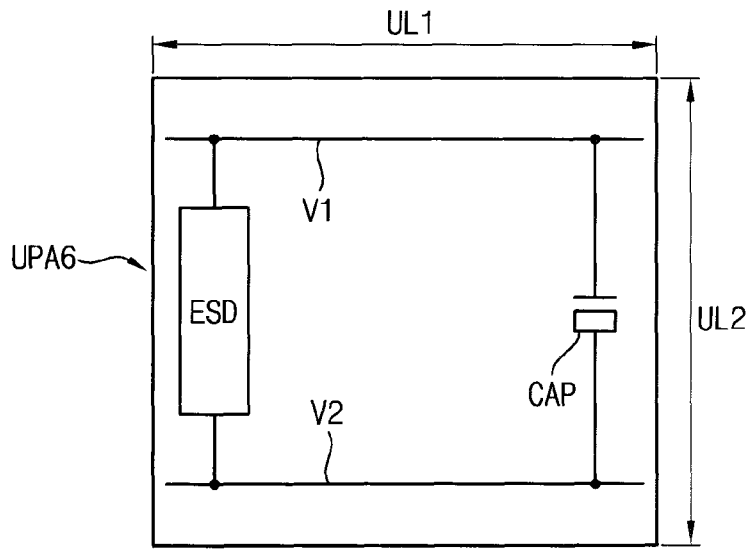

FIGS. 11A, 11B, 12, 13A, 13B and 14 are circuit diagrams illustrating example embodiments of a unit pad area. Unit pad areas UPA1 and UPA2 in FIGS. 11A and 11B represent examples of a data pad area, a unit pad area UPA3 in FIG. 12 represents an example of an address-command pad area, unit pad areas UPA4 and UPA5 in FIGS. 13A and 13B represent examples of a power pad area, and a unit pad area UPA6 in FIG. 14 represents an example of a dummy pad area. The row-directional unit length UL1 and the column-directional unit length UL2 of the unit pad area UPA may be identical to each other or different from each other.

Referring to FIG. 11A, some or all of the output drivers PM1/NM1 and decoupling capacitors CAP may be formed in semiconductor die 90 under each data bump pad. The PMOS transistor PM1 and the NMOS transistor NM1 constituting the output driver may be coupled between a first voltage V1 and a second voltage V2, and also the decoupling capacitor CAP may be coupled between the first voltage V1 and the second voltage V2. For example, the first voltage V1 may be a power supply voltage and the second voltage V2 may be a ground voltage. The output driver PM1/NM1 transfers a read data signal to an external device through the data bump pad DQ during a read operation mode in response to signals DOK and DOKB that are provided from a pre-driver in the input-output control circuit. A write data signal DIN is received through the data bump pad DQ from an external device during a write operation mode, and the received write data signal DIN is provided to the input buffer in the input-output control circuit. In other words, the example of FIG. 11A represents a case where the output driver is formed in semiconductor die 90 under the data bump pad DQ, and the pre-driver and the input buffer are formed in the input-output control circuit.

Referring to FIG. 11B, some or all of the output drivers PM1/NM1, input buffers RCV, and decoupling capacitors CAP may be formed in the semiconductor die under each data bump pad. The input buffer RCV buffers the write data signal DIN and provides an internal input signal DI to the input-output control circuit. As such, the input buffer RCV may be further formed in semiconductor die 90 under each data bump pad as illustrated in FIG. 11B, whereas the input buffer RCV is formed in the input-output control circuit in the example of FIG. 11A.

As described with reference to FIG. 10, the transistors PM1 and NM1 may be formed in substrate region 81 and upper region 82 of semiconductor die 90, and the metal lines for routing the signals DOK, DOKB, DIN and DI and providing the voltages V1 and V2 may be formed in the metal layers 86. In some embodiments, as illustrated in FIG. 13A, an electrostatic discharge protection circuit may be further formed in the data pad area of FIGS. 11A and 11B.

Referring to FIG. 12, gate-coupled transistors PM2 and NM2 and a decoupling capacitor CAP may be formed in semiconductor die 90 under one or more of the address-command bump pads. The unit pad area UPA3 corresponding to the address-command bump pad ADD/CMD does not require a function for outputting signals to an external device, and thus the transistors PM2 and NM2 corresponding to the output driver PM1 and NM1 of FIG. 11A may be used as clamp diodes through gate-coupling. An address-command signal AIN is received through the address-command bump pad ADD/CMD from an external device, and the received address-command signal ADD/CMD is provided to an address-command buffer, etc.

FIG. 13A illustrates an example of the unit pad area UPA4 corresponding to the power bump pad VDDQ for receiving a power supply voltage, and FIG. 13B illustrates an example of the unit pad area UPA5 corresponding to the power bump pad VDDS for receiving a ground voltage. Referring to FIGS. 13A and 13B, a decoupling capacitor CAP may be formed in the semiconductor die under one or more of the power bump pads. In addition, an electrostatic discharge protection circuit ESD may be further formed in semiconductor die 90 corresponding to the power pad area UPA4 and UPA5.

FIG. 14 illustrates a dummy pad area UPA6 corresponding to a dummy pad that is disconnected from an external device. Referring to FIG. 14, a decoupling capacitor CAP may be formed in semiconductor die 90 under each dummy pad. In addition, the electrostatic discharge protection circuit ESD may be further formed in semiconductor die 90 corresponding to the dummy pad area UPA6.

Even though not illustrated in FIGS. 11A, 11B and 12, the electrostatic discharge protection circuit ESD as illustrated in FIG. 13A may be further formed in semiconductor die 90 under the data bump pad and the address-command bump pad. In this case, the electrostatic discharge protection circuit ESD may be pin-to-power coupled between the bump pad and one of the power supply voltage and the ground voltage, or power-to-power coupled between the power supply voltage and the ground voltage.

Figure 15:
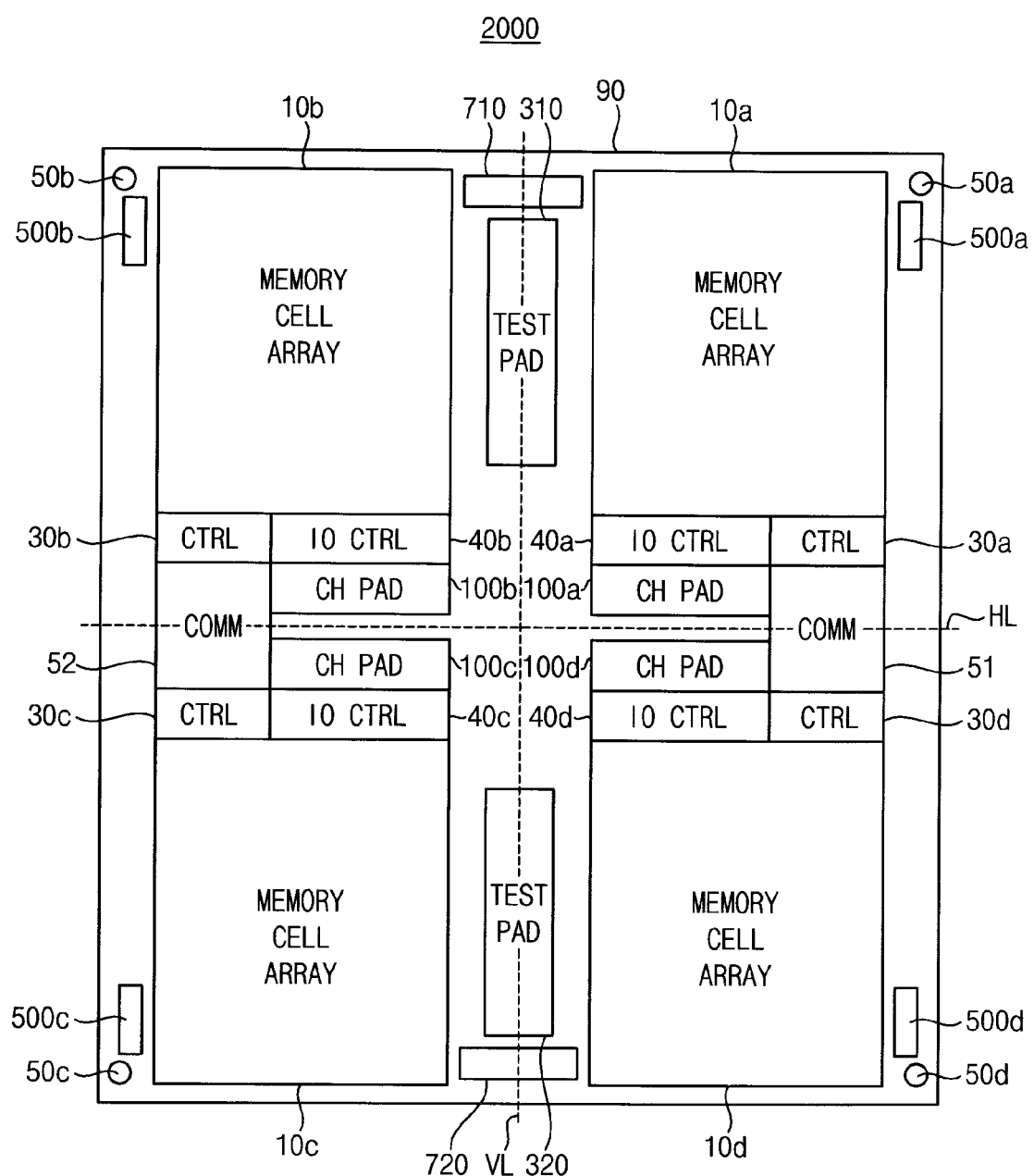
FIG. 15 is a diagram illustrating a layout of a semiconductor memory device according to example embodiments.

FIG. 15 is a diagram illustrating a layout of a semiconductor memory device 2000 according to example embodiments.

Referring to FIG. 15, semiconductor memory device 2000 includes semiconductor die 90 having an input-output bump pad part formed in a central region of semiconductor die 90. Compared with semiconductor memory device 1000 of FIG. 1, semiconductor memory device 2000 of FIG. 15 further includes a support bump pad part 710/720 disposed adjacent to two or more sides of semiconductor die 90, and/or a support bump pad part 500a/500b/500c/500d disposed adjacent to four corners of semiconductor die 90.

When a plurality of memory chips are stacked, or a memory chip and a controller chip are stacked, support bump pad part 710/720, 500a/00b/500c/500d may prevent reliability of a chip-on-chip arrangement from being degraded due to a gap between the stacked chips. The support bump pad part may be disposed symmetrically with respect to the vertical center line VL and/or the horizontal center line HL. For example, the support bump pad part may be disposed adjacent to four corners, two sides, four sides, or combinations thereof.

As described above with reference to FIG. 1, semiconductor die 90 of semiconductor memory device 2000 includes a plurality (e.g., four) of memory cell arrays 10a, 10b, 10c and 10d associated with respective independent channels. The input-output bump pad part provides a plurality of channels for connecting each of the memory cell arrays 10a, 10b, 10c and 10d independently to one or more external devices, such as a memory controller. The input-output bump pad part may include a plurality of channel bump pad parts 100a, 100b, 100c and 100d for independent channels, which respectively correspond to memory cell arrays 10a, 10b, 10c and 10d. Each of the channel bump pad parts 100a, 100b, 100c and 100d includes a plurality of bump pads that are arranged in a matrix of rows and columns.

The semiconductor die 90 may include first circuits CTRL 30a, 30b, 30c and 30d and IO CTRL 40a, 40b, 40c and 40d that control, independently per channel, memory cell arrays 10a, 10b, 10c and 10d, and second circuits COMM 51 and 52 that control commonly memory cell arrays 10a, 10b, 10c and 10d. For effective design of semiconductor memory device 2000, each of the first circuits 30a-30d and 40a-40d may be disposed between the corresponding memory cell array and the corresponding channel bump pad part, and second circuits 51 and 52 may be disposed on both sides of the input-output bump pad part.

First circuits 30 and 40 for controlling independently per channel memory cell arrays 10a, 10b, 10c and 10d may include input-output control circuits IO CTRL 40a-40d and additional control circuits CTRL 30a-30d. Each of the input-output control circuits 40a, 40b, 40c and 40d may be disposed between the corresponding memory cell array 10a, 10b, 10c and 10d and the corresponding channel bump pad part 100a, 100b, 100c and 100d. For efficient signal routing, a row-directional length of each input-output control circuit may be identical to or smaller than a row-directional length of a corresponding channel bump pad part.

In some example embodiments, semiconductor memory device 2000 may further include a test pad part 310/320 for testing operations of semiconductor memory device 2000. A wafer test, etc. may be performed using test pad part 310/320 as illustrated in FIG. 15 instead of using the input-output bump pad part.

As mentioned above, memory cell arrays 10*a*, 10*b*, 10*c* and 10*d*, channel bump pad parts 100*a*, 100*b*, 100*c* and 100*d*, and/or some of the peripheral circuits may be designed using mirror images or shifted images.

As such, once a layout for one channel is designed, the entire layout for the plurality of channels may be obtained by mirroring and/or shifting the designed layout for the one channel. In addition, semiconductor memory device 2000 has the input-output bump pad part formed in the central region of semiconductor die 90, and thus semiconductor memory device 2000 may be conveniently coupled to other devices or chips of various structures or the layout may be easily modified depending on changes of manufacturing process.

Figure 16A:
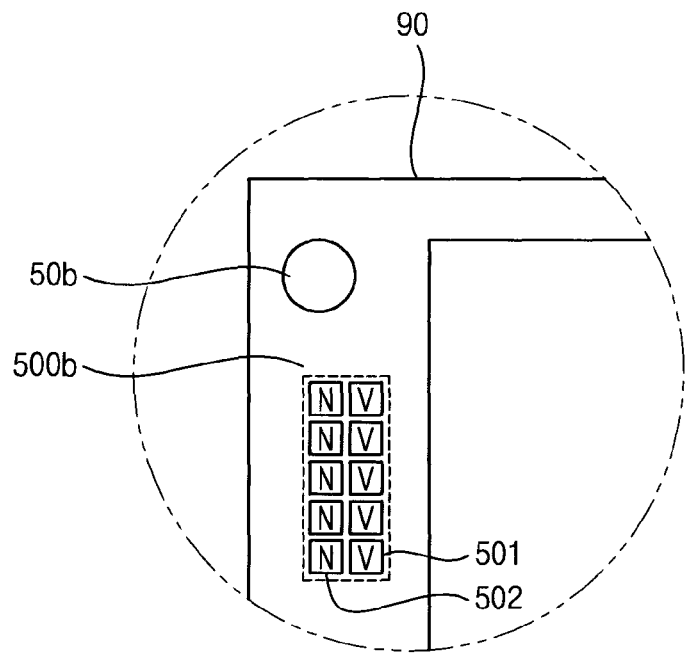
FIGS. 16A and 16B illustrate example embodiments of the support bump pad part in the semiconductor memory device of FIG. 15.
Figure 16B:
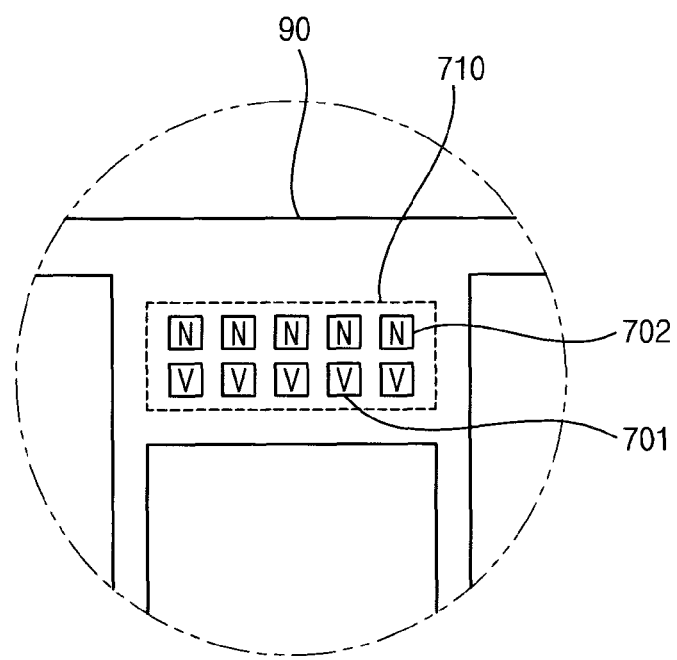

FIGS. 16A and 16B illustrate example embodiments of the support bump pad part in semiconductor memory device 2000 of FIG. 15.

FIG. 16A illustrates support bump pad part 500*b* disposed adjacent to the corner of semiconductor die 90, and FIG. 16B illustrates support bump pad part 710 disposed adjacent to the side of semiconductor die 90. An alignment mark 50*b* may be formed near the corner of semiconductor die 90. Referring to FIGS. 16A and 16B, support bump pad parts 500*b* and 710 may include a plurality of dummy pads N 502 and 702, respectively, which provide physical support when a plurality of chips are stacked. In some embodiments, support bump pad part 500*b* and 710 may further include one or more power bump pads V 501 and 701, respectively, receiving power supply voltages. If the power bump pads are included only in the input-output bump pad part that is formed in the central region of semiconductor die 90, voltage characteristics may be degraded near the corner and/or the side of semiconductor die 90 due to voltage drops according to the increased voltage supply path. To supplement such degradation of voltage characteristics, some dummy pads in support bump pad parts 500*b* and 710 may be replaced with power bump pads 501 and 701.

Figure 17:
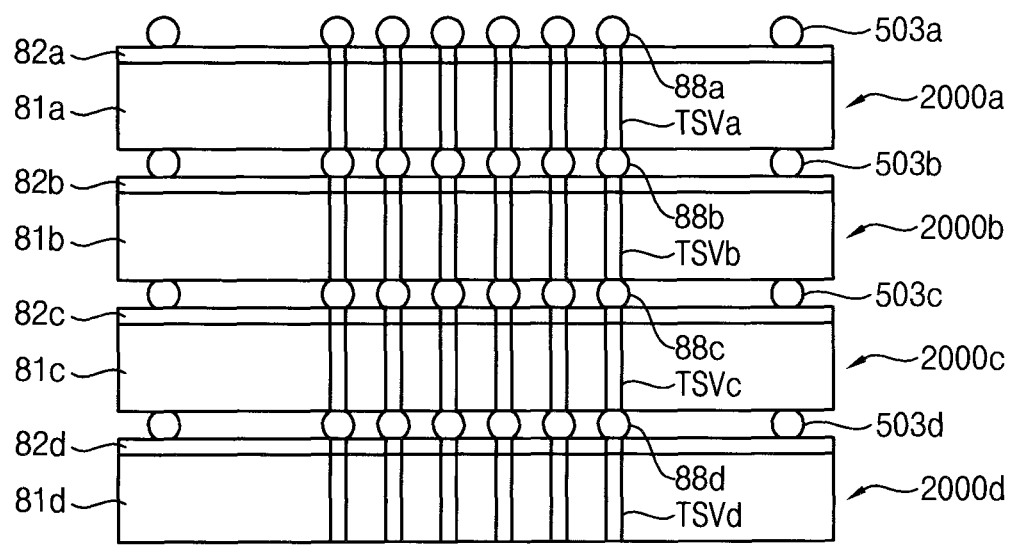
FIG. 17 illustrates a stacked semiconductor memory device according to example embodiments.

FIG. 17 illustrates a stacked semiconductor memory device 3000 according to example embodiments.

Referring to FIG. 17, semiconductor memory device 3000 includes a plurality of memory chips 2000*a*, 2000*b*, 2000*c* and 2000*d* that are stacked. Each of the memory chips 2000*a*, 2000*b*, 2000*c* and 2000*d* includes a semiconductor die having a substrate region 81 and an upper region 82, and an input-output bump pad part formed in a central region of the corresponding semiconductor die, as described above. Each semiconductor die includes a plurality of memory cell arrays, and the plurality of input-output bump pad parts respectively formed in the central region of each semiconductor die provide a plurality of channels for connecting each of the memory cell arrays independently to one or more external devices.

Each of the memory chips 2000*a*, 2000*b*, 2000*c* and 2000*d* may further include a support bump pad part that is disposed adjacent to four corners of each semiconductor die, or disposed adjacent to two or more sides of each semiconductor die. In FIG. 17, the bumps in the central regions of the semiconductor dies represent input-output bumps 88*a*, 88*b*, 88*c* and 88*d*, and the bumps in the marginal or edge regions of the semiconductor dies represent support bumps 503*a*, 503*b*, 503*c* and 503*d*.

In some embodiments, the semiconductor dies may further include through-silicon-vias TSVa, TSVb, TSVc and TSVd for electrically connecting the input-output bump pad parts formed in the central region of the semiconductor dies. For example, the through-silicon-vias TSVa of first memory chip 2000*a* may electrically connect input-output bump 88*a* of first memory chip 2000*a* and input-output bump 88*b* of second memory chip 2000*b*. As such, input-output bumps 88*a*, 88*b*, 88*c* and 88*d* may be electrically coupled using the through-silicon-vias TSVa, TSVb, TSVc and TSVd.

Figure 18:
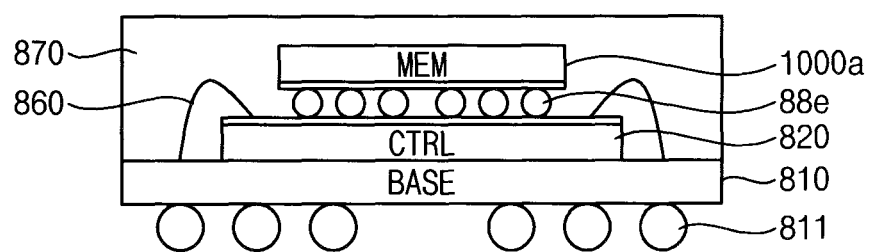
FIGS. 18 and 19 illustrate semiconductor packages according to example embodiments.
Figure 19:
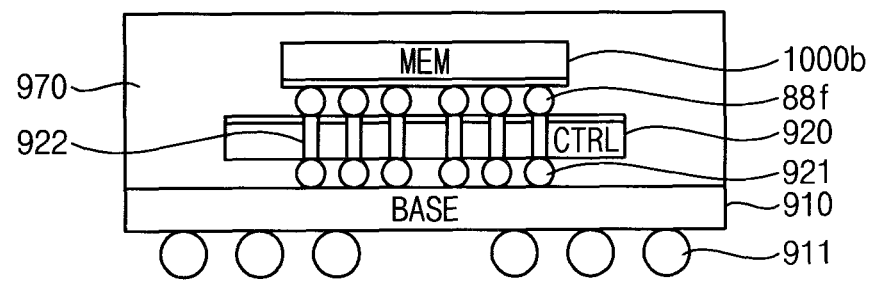

FIGS. 18 and 19 illustrate semiconductor packages according to example embodiments.

Referring to FIG. 18, a semiconductor package 4000 includes a base substrate BASE 810, a controller chip CTRL 820 disposed on base substrate 810, and at least one semiconductor memory chip MEM 1000*a* disposed on controller chip 820. Base substrate 810 may be a printed circuit board, and controller chip 820 may include a microprocessor unit (MPU). After the substrate 810 and chips 820 and 1000*a* are stacked, the upper portion of the semiconductor package 4000 may be covered with resin 870. Semiconductor memory chip 1000*a* may be one of the semiconductor memory devices 1000, 2000 and 3000 described with reference to FIGS. 1 through 17. As described above, semiconductor memory chip 1000*a* includes a semiconductor die and an input-output bump pad part formed in a central region of the semiconductor die. The semiconductor die includes a plurality of memory cell arrays, and the input-output bump pad part provides a plurality of channels for connecting each of the memory cell arrays independently to controller chip 820.

In the embodiment of FIG. 18, semiconductor memory chip 1000*a* and controller chip 820 may be electrically connected to each other through input-output bumps 88*e* that are formed on semiconductor memory chip 1000*a*, and controller chip 820 and base substrate 810 may be electrically connected to each other using wires 860. Bumps 811 for electrical connection to an external device may be formed under the bottom surface of base substrate 810.

Referring to FIG. 19, a semiconductor package 5000 includes a base substrate BASE 910, a controller chip CTRL 920 disposed on the base substrate 910, and at least one semiconductor memory chip MEM 1000*b* disposed on controller chip 920. Base substrate 910 may be a printed circuit board, and controller chip 920 may include a microprocessor unit (MPU). After the substrate 910 and chips 920 and 1000*b* are stacked, the upper portion of the semiconductor package 5000 may be covered with resin 970. Semiconductor memory chip 1000*b* may be one of the semiconductor memory devices 1000, 2000 and 3000 described with reference to FIGS. 1 through 17. As described above, semiconductor memory chip 1000*b* includes a semiconductor die and an input-output bump pad part formed in a central region of the semiconductor die. The semiconductor die includes a plurality of memory cell arrays, and the input-output bump pad part provides a plurality of channels for connecting each of the memory cell arrays independently to controller chip 920.

In the embodiment of FIG. 19, semiconductor memory chip 1000*b* and controller chip 920 may be electrically connected to each other through the input-output bumps 88*f* that are formed on semiconductor memory chip 1000*b*, and controller chip 920 and base substrate 810 may be electrically connected to each other using bumps 921 that are formed under the bottom surface of controller chip 920. Controller chip 920 may include through-silicon vias 922 to reduce interfacing resistance between base substrate 910 and controller chip 920, compared with the wire bonding of FIG. 18. Bumps 911 for electrical connection to an external device may be formed under the bottom surface of base substrate 910.

As illustrated in FIGS. 18 and 19, semiconductor memory devices 1000*a* and 1000*b* providing the wide input-output interface are effectively adopted in flip-chip packaging, where the semiconductor memory chip is mounted or stacked on the controller chip such that the upper region of the semiconductor die in the semiconductor memory faces towards the controller chip. The flip-chip packaging may be effectively performed by forming the input-output bump pad part in the central region of the semiconductor die in the semiconductor memory device, and by forming pads of the controller chip at the corresponding positions. Further the above mentioned support bump pad part may provide physical support between the stacked chips, thereby enhancing reliability of chip-on-chip packaging.

The semiconductor memory device according to the described embodiments may be used in devices and systems requiring high performance through multi-channel and wide input-output interface, particularly in mobile devices and systems requiring low power consumption.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device comprising:
    a plurality of semiconductor dies that are stacked, each semiconductor die including a plurality of memory cell arrays; and
    a plurality of input-output bump pad parts respectively located at a central region of each semiconductor die, the input-output bump pad parts providing a plurality of channels each dedicated to only a respective one of the memory cell arrays and by which each of the memory cell arrays can be connected independently of each other to one or more external devices,
    wherein each of the input-output bump pad parts includes a plurality of channel bump pad parts associated with the memory cell arrays, respectively,
    each of the channel bump pad parts includes a plurality of bump pads that are arranged in a matrix of rows and columns, and
    the bump pads of each of the channel bump parts include power bump pads dedicated to receive power supply voltages.

2. The semiconductor memory device of claim 1, wherein each of the channel bump pad parts comprises an address-command pad block including address-command bump pads, and a plurality of data pad blocks each including data bump pads.

3. The semiconductor memory device of claim 2, wherein the address-command pad block is disposed between the data pad blocks or at one side of the plurality of the data pad blocks.

4. The semiconductor memory device of claim 2, wherein each of the data pad blocks also includes at least one row of respective ones of the power bump pads.

5. The semiconductor memory device of claim 2, wherein each of the data pad blocks also includes at least one column of respective ones of the power bump pads.

6. The semiconductor memory device of claim 2, wherein each of the data pad blocks includes respective ones of the power bump pads, the power bump pads of each of the data pad blocks are disposed in a central region of the data pad block, and the data bump pads of each of the data pad blocks surround the power bump pads of the data pad block.

7. The semiconductor memory device of claim 2,
    wherein each semiconductor die includes a substrate, and an output driver, a decoupling capacitor and an input buffer disposed in the substrate under each data bump pad.

8. The semiconductor memory device of claim 1, wherein each semiconductor die includes a plurality of input-output control circuits, each of the input-output control circuits being disposed between a corresponding one of the memory cell arrays and a corresponding one of the channel bump pad parts.

9. The semiconductor memory device of claim 8, wherein a row-directional length of each input-output control circuit is identical to or smaller than a row-directional length of each channel bump pad part.

10. The semiconductor memory device of claim 8, wherein each of the data pad blocks includes N data bump pads, where N is a positive integer, and
    wherein N output drivers and N input buffers are disposed in the corresponding input-output control circuit and in the semiconductor die under the corresponding channel bump pad part.

11. The semiconductor memory device of claim 1, wherein the bump pads of each of the channel bump pad parts also include a plurality of address-command bump pads, and
    each semiconductor die further includes a substrate, and a decoupling capacitor disposed in the substrate under each address-command bump and under each power bump pad.

12. The semiconductor memory device of claim 11, wherein each semiconductor die further includes at least one clamp diode and one electrostatic discharge protection circuit disposed in the substrate under each address-command bump pad.

13. The semiconductor memory device of claim 11, wherein each semiconductor die further includes an electrostatic discharge protection circuit disposed in the substrate under each power bump pad.

14. The semiconductor memory device of claim 1, further comprising:
    a plurality of support bump pad parts, each support bump pad part being disposed adjacent to four corners of each semiconductor die or disposed adjacent to two or more sides of each semiconductor die.

15. The semiconductor memory device of claim 14, wherein each support bump pad part includes power bump pads receiving power supply voltages.

16. The semiconductor memory device of claim 1, wherein each semiconductor die further includes through-silicon-vias for electrically connecting the input-output bump pad parts.

17. A semiconductor memory device comprising:
- a plurality of semiconductor dies that are stacked, each semiconductor die including a plurality of memory cell arrays;
- a plurality of input-output bump pad parts respectively located at a central region of each semiconductor die, the input-output bump pad parts providing a plurality of channels each dedicated to only a respective one of the memory cell arrays and by which each of the memory cell arrays can be connected independently of each other to one or more external devices; and
- a plurality of test pad parts respectively located at each semiconductor die for testing operations of the semiconductor memory device.

18. The semiconductor memory device of claim 17, wherein the test pad part is disposed in a column direction along a vertical center line of the semiconductor die, or disposed in the column direction adjacent to left and right sides of the semiconductor die.

19. The semiconductor memory device of claim 17, wherein the test pad part is disposed in a row direction along a horizontal center line of the semiconductor die, or disposed in the row direction adjacent to upper and bottom sides of the semiconductor die.

20. A semiconductor package comprising:
- a base substrate;
- a controller chip disposed on the base substrate; and
- at least one semiconductor memory device disposed on the controller chip, the semiconductor memory device comprising:
  - a semiconductor die including,
    - a plurality of memory cell arrays; and
    - an input-output bump pad part located at a central region of the semiconductor die, the input-output bump pad part providing a plurality of channels each dedicated to only a respective one of the memory cell arrays and by which each of the memory cell arrays can be connected independently of each other to the controller chip,
- wherein each of the input-output bump pad parts includes a plurality of channel bump pad parts associated with the memory cell arrays, respectively,
- each of the channel bump pad parts includes a plurality of bump pads that are arranged in a matrix of rows and columns, and
- the bump pads of each of the channel bump parts include power bump pads dedicated to receive power supply voltages.

* * * * *